United States Patent [19]
Fukase

[11] Patent Number: 5,989,960
[45] Date of Patent: Nov. 23, 1999

[54] SEMICONDUCTOR DEVICE AND METHOD FOR FABRICATING THE SAME

[75] Inventor: Kenji Fukase, Ogaki, Japan

[73] Assignee: Sanyo Electric Co., Ltd., Osaka, Japan

[21] Appl. No.: 08/964,590

[22] Filed: Nov. 5, 1997

Related U.S. Application Data

[62] Division of application No. 08/603,747, Feb. 20, 1996, Pat. No. 5,796,139.

[30] Foreign Application Priority Data

Feb. 23, 1995 [JP] Japan ........................................ 7-35656
Jan. 22, 1996 [JP] Japan ........................................ 8-8581

[51] Int. Cl.[6] .............................................. H01L 21/8247
[52] U.S. Cl. ............................................ 438/267; 438/596
[58] Field of Search .................................. 438/258, 266, 438/267, 595, 596

[56] References Cited

U.S. PATENT DOCUMENTS

| | | | |
|---|---|---|---|
| 4,629,520 | 12/1986 | Ueno et al. | 438/564 |
| 5,029,130 | 7/1991 | Yeh | 365/185 |
| 5,030,584 | 7/1991 | Nakata | 438/564 |
| 5,063,172 | 11/1991 | Manley | 438/267 |
| 5,108,939 | 4/1992 | Manley et al. | 438/267 |
| 5,323,037 | 6/1994 | Su | 257/306 |
| 5,444,653 | 8/1995 | Nagasawa et al. | 365/149 |
| 5,494,838 | 2/1996 | Chang et al. | 438/267 |
| 5,585,293 | 12/1996 | Sharma et al. | 438/267 |

FOREIGN PATENT DOCUMENTS

| | | |
|---|---|---|
| 1-307247 | 12/1989 | Japan . |
| 2-101532 | 8/1990 | Japan . |
| 2-235358 | 9/1990 | Japan . |
| 5-226334 | 3/1993 | Japan . |
| 80106929 | 9/1991 | Taiwan . |
| 83101499 | 1/1994 | Taiwan . |
| WO 92/18980 | 10/1992 | WIPO . |

OTHER PUBLICATIONS

Wang, et al., "A Study of Plasma Treatments on Siloxane SOB," IEEE VMIC Conference, Jun. 7–8, 1994, pp. 101–107.

Chiang et al., Defects Study on Spin on Glass Planarization Technology, IEEE VMIC Conference, Jun. 15–16, 1987, pp. 404–412.

Lai–Juh Chen, et al., "Fluorine–Implanted Treatment (FIT) SOG for the Non–Etchback Intermetal Dielectric," IEEE VMIC Conference, Jun. 7–8, 1994, pp. 81–86.

Moriya et al., "Modification Effects in Ion–Implanted $SiO_2$ Spin–on–Glass," *J. Electrochem. Soc.*, vol. 140, No. 5, May 1993, pp. 1442–1450.

Matsuura et al., "An Advanced Interlayer Dielectric System with Partially Converted Organic SOG Using Plasma Treatment," IEEE VMIC Conference, Jun. 8–9, 1993, pp. 113–115.

Ishida et al., "Mechanism for AlSiCu Alloy Corrosion," *Jpn. J. Appl. Phys.*, vol. 31 (1992), pp. 2045–2048.

Doki et al., "Moisture–Blocking Mechanism of ECR–Plasma," IEEE VMIC Conference, Jun. 7–8, 1994, pp. 235–139.

Shimokawa et al., "Suppression of MOSFET hot carrier degradation by P–SiO underlayer," *The Institute of Electronics, Information and Communication Engineers,* Technical Report of IEICE, SDM92–133 (1992–12), pp. 89–94.

Murase et al., "Dielectric Constant of Silicon Dioxide Deposited by Atmospheric–Pressure Chemical Vapor Deposition Using Tetraethylorthosilicate and Ozone," *Jpn. J. Appl. Phys.*, vol. 33 (1994), pp. 1385–1389.

*Primary Examiner*—Chandra Chaudhari
*Attorney, Agent, or Firm*—Sheridan Ross PC

[57] ABSTRACT

A split gate type transistor device and a method for making it. The transistor has a substrate, and a floating gate electrode is located on the substrate. A control gate electrode is provided having thick and thin film sections over the floating electrode. A source region and a drain region are formed separately in the substrate. The thin film section is formed partially over the drain region and impurity is passed into the substrate through the thin film section to form the drain region.

13 Claims, 21 Drawing Sheets

Fig.10

| operation mode | common source line SL (source region 3) | bit lines BLa to BLz (drain region 4) | word lines WLa to WLz (control gate) (electrode 9) |
|---|---|---|---|
| write mode | 12V | 0V | 2V |
| erase mode | 0V | 0V | 14 to 15V |
| read mode | 0V | 2V | 4V |

Fig.18

| operation mode | common source line SL (drain region 4) (source region) | bit lines BLa to BLz (source region 3) (drain region) | word lines WLa to WLz control gate (electrode 9) |
|---|---|---|---|
| write mode | 0V | 12V | 2V |
| erase mode | 0V | 0V | 14 to 15V |
| read mode | 0V | 2V | 4V |

SEMICONDUCTOR DEVICE AND METHOD FOR FABRICATING THE SAME

This is a divisional application based on application Ser. No. 08/603,747, filed Feb. 20, 1996 and now U.S. Pat. No. 5,796,139.

BACKGROUND OF THE INVENTION

1. Field of the Invention

The present invention relates generally to a semiconductor device and a method for fabricating the same. More particularly, this invention relates to a split gate type transistor, a method for fabricating the same, and a non-volatile semiconductor memory device using split gate type transistors (or memory cells).

2. Description of the Related Art

Recently, a great attention is being paid to non-volatile semiconductor memory devices which include an FRAM (Ferro-electric Random Access Memory), EPROM (Erasable and Programmable Read Only Memory) and EEPROM (Electrically Erasable and Programmable Read Only Memory). The EPROM and EEPROM read data as the floating gate electrode retains charges and the control gate electrode detects a change in threshold voltage according to the amount of the charges. The EEPROM includes a flash EEPROM which can collectively erase data in a whole memory cell array or can partially erase data, block by block, from a memory cell array separated into a plurality of blocks.

A plurality of memory cells (or memory cell transistors) of a flash EEPROM are classified to two types: stacked gate type and split gate type. FIG. 1 shows the cross section of a stack gate type memory cell (or transistor). This memory cell has a P-type single crystalline silicon substrate 101 on which an N-type source region 102 and an N-type drain region 103 are formed with a channel region 104 defined between the two regions. A floating gate electrode 106 is formed over the channel region 104 in a silicon oxide film 105. A control gate electrode 108 is formed over the floating gate electrode 106 in a silicon oxide film 107. Those gate electrodes 106 and 108 have the same width and are stacked one on the other in exact alignment. There are a plurality of floating gate electrodes 106 extending in the direction normal to sheet, while the control gate electrode 108 also extends in the direction normal to the sheet to be shared by the individual floating gate electrodes 106. This control gate electrode 108 serves as a word line.

In this flash EEPROM, each stacked gate type memory cell cannot self-select (or self-determine) its own ON/OFF state. At the time of data erasure, therefore, excess charge draining (excess erasure) from the floating gate electrode 106 allows the associated memory cell to keep the ON state irrespective of the voltage (0V) applied to the control gate electrode 108. This prevents data from being read from the memory cells. To prevent this excess erasure, the erasing procedures of the individual memory cells should be controlled by a peripheral circuit or an external circuit connected to the memory device.

International Publication Number WO92/18980 discloses split gate type memory cells (or transistors) which can avoid such a problem of excess erasure without controlling such erasing procedures. FIG. 2 shows the cross section of this type of memory cell. Within a P-type single crystalline silicon substrate 101 are defined an N-type source region 102 and an N-type drain 103 with a channel region 104 therebetween. A floating gate electrode 106 is formed over a portion of the channel region 104 and a portion of the source region 102 with a relatively thin silicon oxide film 105. A control gate electrode 111 includes a first section 113 and a second section 114. The first section 113 is formed over the floating gate electrode 106 in a relatively thick silicon oxide film 112. The second section 114 is formed over a portion of the channel region 104 in the silicon oxide film 105 and is located directly adjacent to the side wall of the silicon oxide film 112. The second section 114 serves as a select gate, which, together with the source region 102 and drain region 103, forms a select transistor 115. In the split gate type memory cell, therefore, a transistor, which is formed by the floating gate 106, the first section 113 and the source and drain regions 102 and 103, is connected in series to the select transistor 115. This select transistor 115 allows each memory cell to self-select the ON/OFF state. In other words, even when charges are excessively drained from the floating gate 106 so that the channel beneath the gate 106 reaches the ON state, it is possible to selectively make the select transistor 115 conductive or non-conductive by controlling the voltage potential at the control gate 111. U.S. Pat. No. 5,029,130 discloses a flash EEPROM in which the source region 102 is used as a drain region and the drain region 103 is used as a source region.

The source and drain regions 102 and 103 are formed by ion implantation of an impurity in the surface of the silicon substrate 101. In this process, the floating gate 106 and control gate 111 are used as an ion implantation mask. Accordingly, the position of the drain region 103 is determined by the location of the select gate 114, and the position of the source region 102 is determined by the location of the floating gate 106. The floating gate 106 and control gate 111 are separately formed by the deposition of an electrode material, lithography and etching. Therefore, the positions of the floating gate 106 and control gate 111 are not self-aligned but are determined by the mask alignment by lithography.

Suppose that an etching mask 121 is formed slightly off the optimal position as shown in FIG. 3A. When etching is performed under this condition, the shapes of the adjoining control gates 111 become different from each other. As shown in FIG. 3B, the drain region 103 is formed by ion implantation of an impurity in the surface of the silicon substrate 101 with the control gates 111 used as a mask. Consequently, the channel length L1 of the select transistor 115 of one of the adjoining memory cells 122 and 123 does not coincide with the channel length L2 of the other select transistor 115. If the select gate 114 is shorter than the first section 113 in the memory cell 122, the channel length L1 of the select transistor 115 becomes short. If the select gate 114 is longer than the first section 113 in the memory A cell 123, on the other hand, the channel length L2 of the select transistor 115 becomes longer. The select transistor 115 having the long channel length L2 increases the resistance of the channel region 104. As a result, the charge implantation in the floating gate 106 takes a longer time, thus impairing the data writing characteristic. The select transistor 115 having the short channel length L1 decreases the resistance of the channel region 104. Consequently, the select transistor 115 is always turned on so that the associated memory cell does not perform a predetermined operation.

To avoid this drawback, it is necessary to previously provide the positional relation between the individual gates 106 and 111 and the individual regions 102 and 103 with some flexibility in consideration of the precision of the mask alignment as well as the precision of the sizes of the gates 106 and 111. The recent semiconductor technology ensures a work precision of approximately 0.05 µm for thin lines that have widths of around 0.5 µm. The mask alignment precision however is as high as approximately 0.1 to 0.2 µm. This precision hinders the miniaturization of split gate type memory cells, making it difficult to ensure higher integration of flash EEPROMs.

Recently, for MOS (Metal Oxide Semiconductor) transistors, MIS (Metal Insulator Semiconductor) transistors, IGFETs (Insulated Gate Field Effect Transistors) and JFETs (Junction Field Effect Transistors), there is the same demand for further miniaturization as in the case of the split gate type memory cells. In manufacturing an MOS transistor, for instance, a film for forming a gate electrode is formed first. Then, a mask is formed on that film to perform etching, thus yielding a gate electrode of the desired shape. To form the gate electrode that has a short width effective for the miniaturization of transistors, the width of the mask corresponding to the gate electrode should be narrowed. It is, however, difficult to accurately form a mask with a narrow width. The controllability and reproducibility of the gate electrodes having narrow widths are poor, which frustrates the further miniaturization of MOS transistors.

SUMMARY OF THE INVENTION

Broadly speaking, the present invention relates to a miniaturized semiconductor device.

The invention also relates to a miniaturized split gate type transistor.

The invention further relates to a non-volatile semiconductor memory device having miniaturized split gate type transistors.

A first embodiment of semiconductor device according to the invention includes: a semiconductor substrate having a first conductivity; a projection located on the semiconductor substrate and having a side wall; an insulating layer formed on the projection and the semiconductor substrate; a gate electrode located on the insulating layer and adjacent to the side wall of the projection; first and second regions defined apart from each other in the semiconductor substrate and having the second conductivity; and a channel region defined between the first and second regions in the semiconductor substrate. The projection is a diffusion source to be used to diffuse an impurity in the semiconductor substrate to form the first region having a second conductivity. The first region is defined directly below the projection.

A second embodiment of semiconductor device according to the invention includes: a semiconductor substrate having a first conductivity; a projection located on the semiconductor substrate and having a side wall; an insulating layer formed on the projection and the semiconductor substrate; a gate electrode located on the insulating layer and adjacent to the side wall of the projection; first and second regions defined apart from each other in the semiconductor substrate and having the second conductivity; and a channel region defined between the first and second regions in the semiconductor substrate. The projection is a diffusion source to be used to diffuse an impurity in the semiconductor substrate to form the first region having a second conductivity. The first region is defined directly below the projection. The gate electrode has a thick film section and a thin film section. The thick film section is located on the insulating layer and adjacent to the side wall of the projection. A portion of the first region is defined under the thin film section.

A third embodiment of a split gate type transistor according to the invention includes: a floating gate electrode; a side wall spacer adjoining a side wall of the floating gate electrode; and a control gate electrode having a first section, located over the floating gate electrode, and a second section covering the side wall spacer. The side wall spacer and the second section serve as a select gate and form a thick film section and a thin film section. The thick film section is adjacent to the side wall of the floating gate.

A fourth embodiment of a split gate type transistor according to the invention includes: a semiconductor substrate having a first conductivity; a floating gate electrode located on the semiconductor substrate; a control gate electrode having a first section, located over the floating gate electrode, and a second section as a select gate; and a region having a second conductivity defined in the semiconductor substrate in the vicinity of the second section. The second section has a thick film section and a thin film section. The thick film section is located over the semiconductor substrate and adjacent to a side wall of the floating gate electrode. A portion of the region is defined under the thin film section.

A fifth embodiment of a split gate type transistor according to the invention includes: a floating gate electrode; a control gate electrode having a first section, located over the floating gate electrode, and a second section adjacent to the floating gate; and a side wall spacer located on the second section. The second section has a thick film section and a thin film section. The thick film section is adjacent to the side wall of the floating gate. The side wall spacer is located on the thin film section and adjacent to the thick film section.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings.

FIG. 10 is a diagram showing voltages to be applied to a source line, bit lines and word lines in individual operation modes of the flash EEPROM in FIG. 9;

FIG. 18 is a diagram showing voltages to be applied to a source line, bit lines and word lines in individual operation modes of the flash EEPROM in FIG. 17.

DETAILED DESCRIPTION OF THE PREFERRED EMBODIMENTS

First Embodiment

Figure 1:
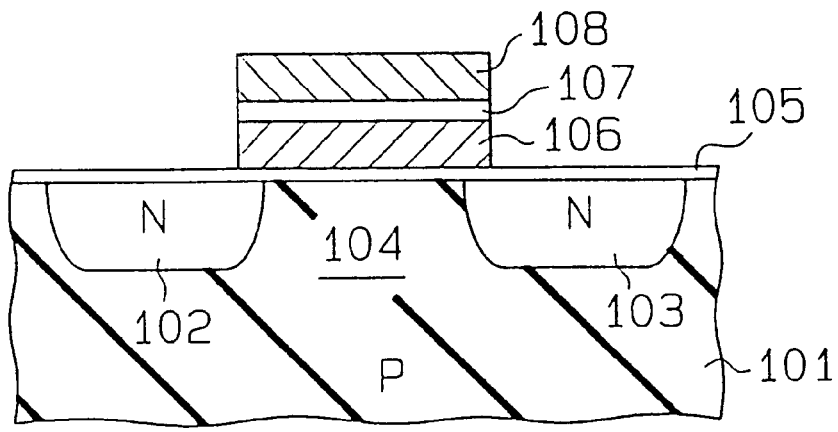
FIG. 1 is a cross-sectional view of a prior art stacked gate type memory cell.
Figure 2:
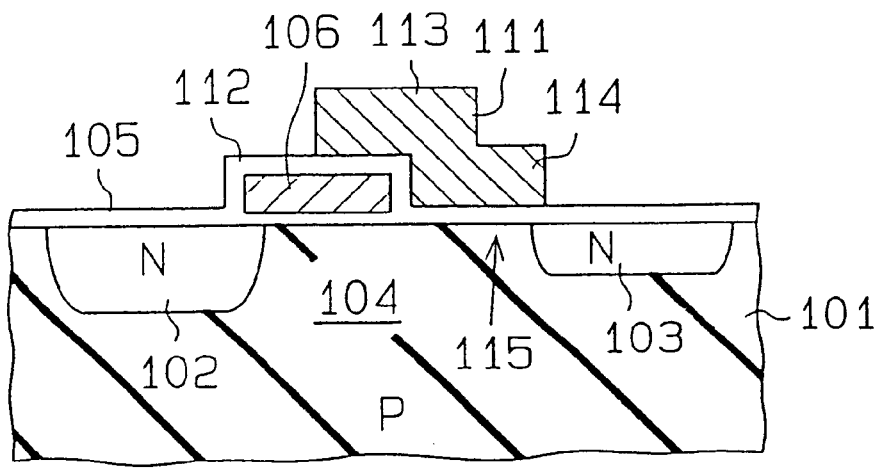
FIG. 2 is a cross-sectional view of a prior art split gate type memory cell.
Figure 3A:
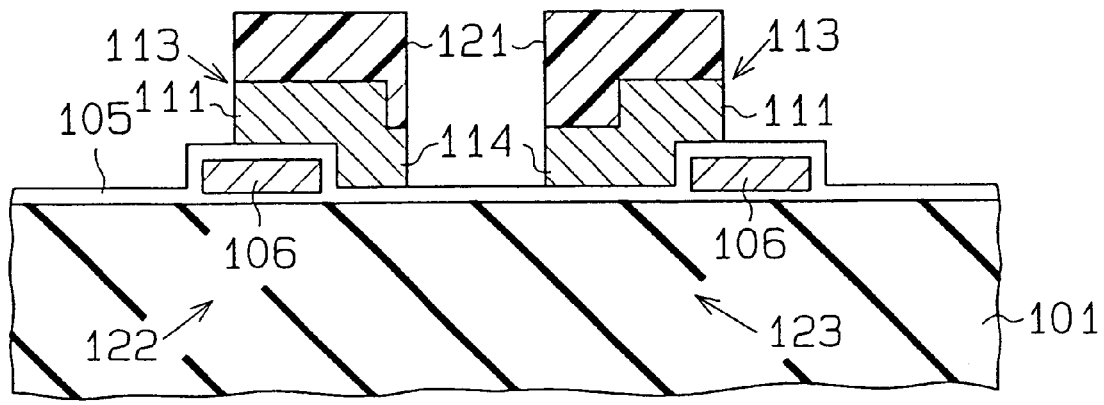
FIGS. 3A and 3B are cross-sectional views showing steps of forming a drain region in a prior art memory cell.
Figure 3B:
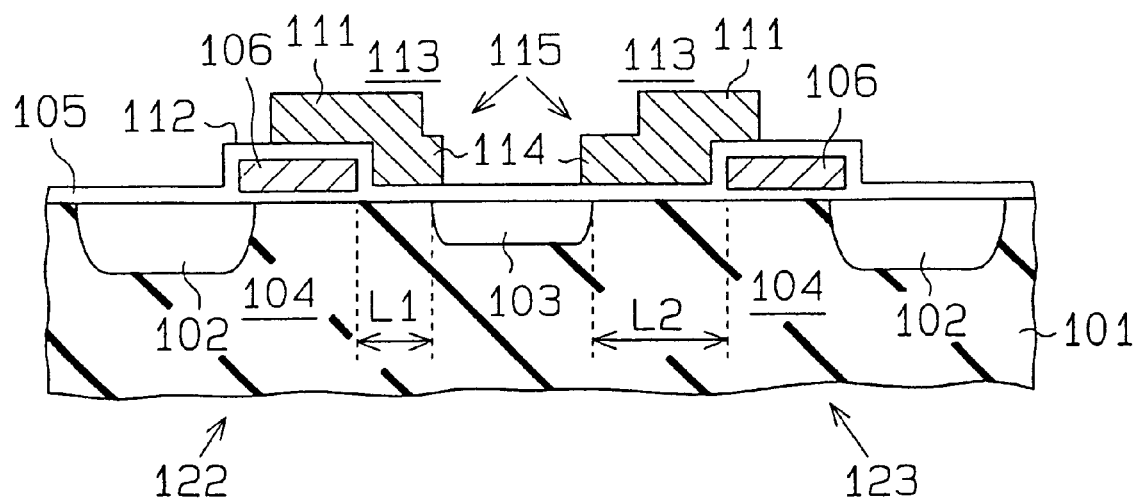
Figure 4:
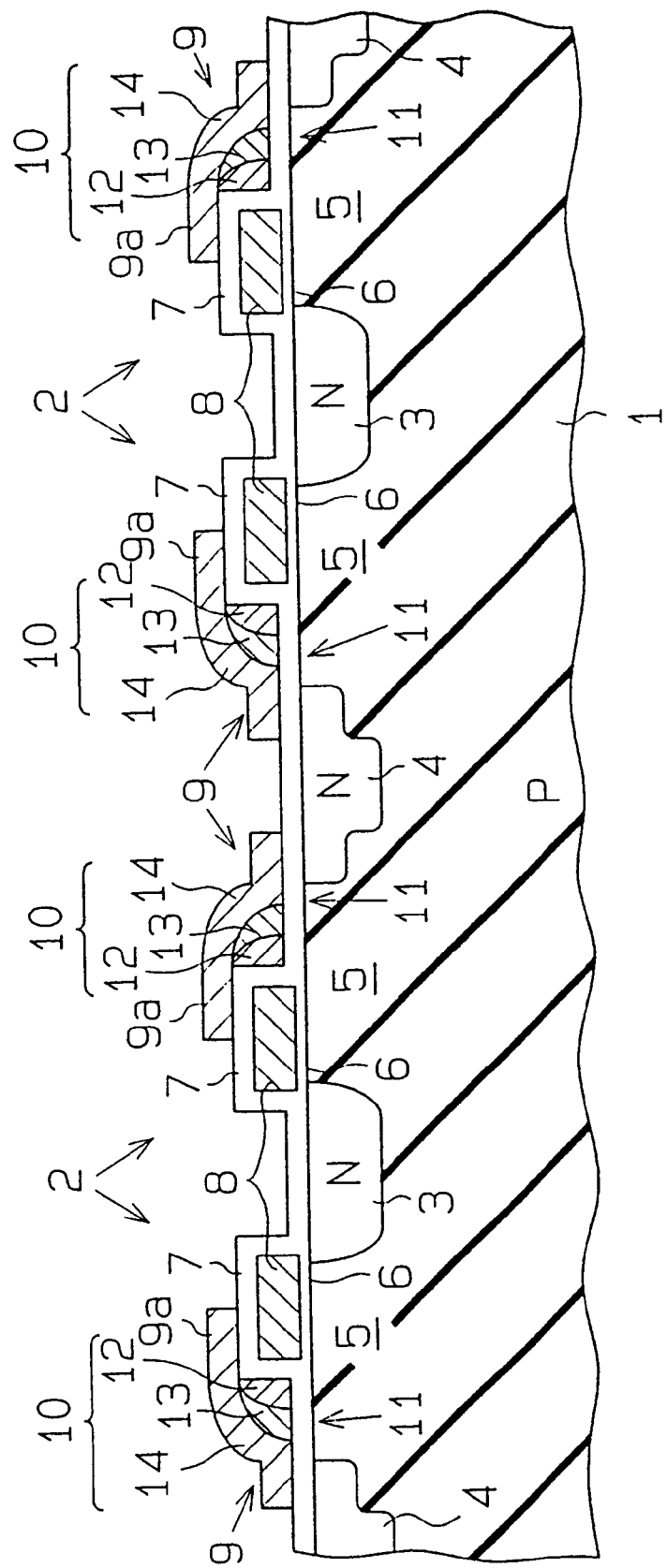
FIG. 4 is a cross-sectional view showing a memory cell array of a flash EEPROM according to the first embodiment of this invention.
Figure 5:
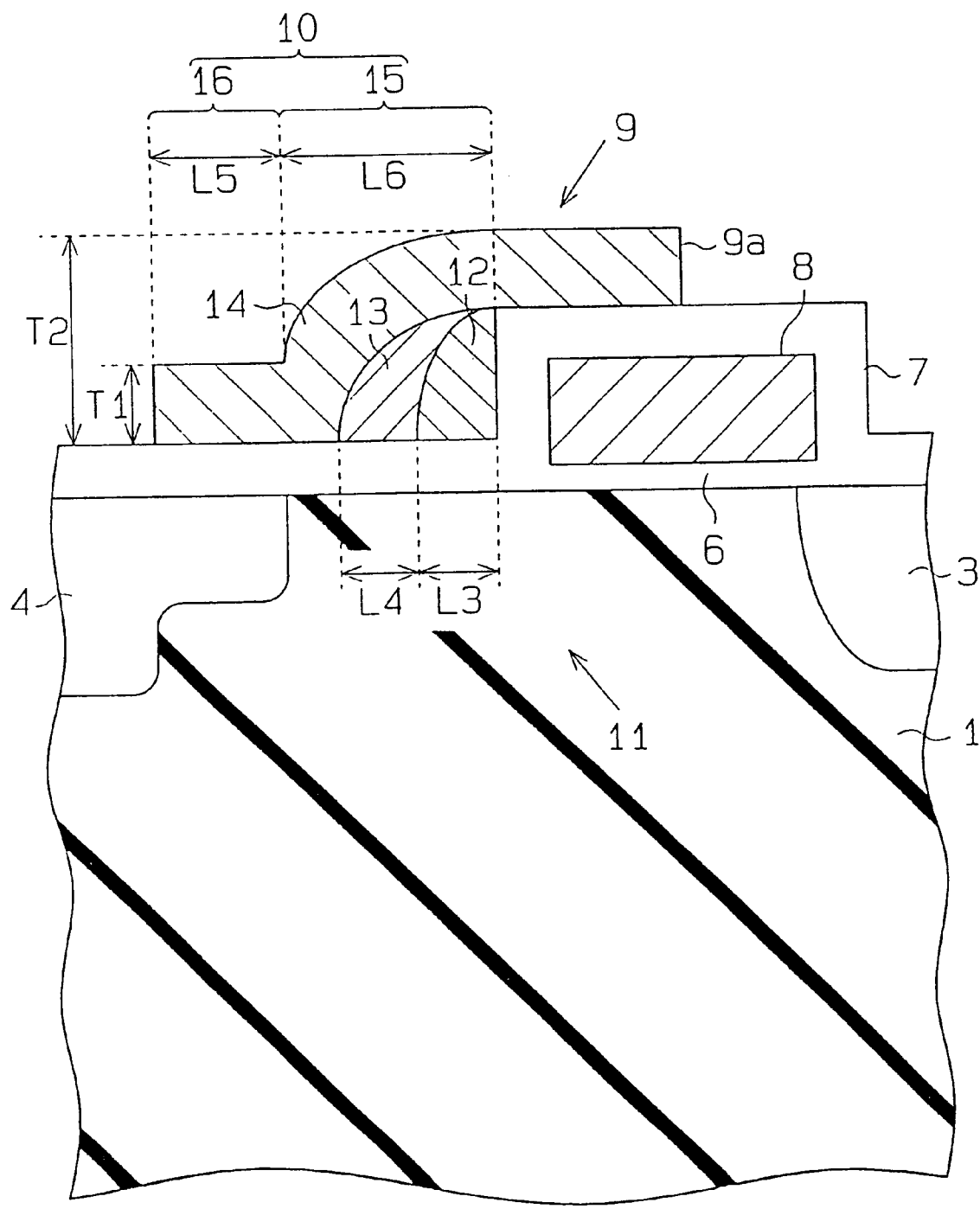
FIG. 5 is a cross-sectional view showing a memory cell.

FIG. 4 is a cross-sectional view showing a part of the memory cell array of a flash EEPRON according to the first embodiment. FIG. 5 is a cross-sectional view showing a memory cell. The memory cell array has a plurality of split gate type memory cells (or transistors) 2. The individual memory cells 2 have a common P-type single crystalline silicon substrate 1 as a semiconductor substrate. Within the substrate 1 are defined an N-type source region 3 and an N-type drain region 4 with a channel region 5 therebetween. A floating gate electrode 8 is formed over a portion of the channel region 5 and a portion of the source region 3 in a relatively thin first silicon oxide film 6 serving as an insulating layer.

A control gate electrode 9 includes a first section 9a and a second section 14. The first section 9a is formed over the floating gate electrode 8 in a relatively thick second silicon oxide film 7 serving as an insulating layer. The first and second silicon oxide films 6 and 7 become integrated by the formation process, excluding the portion directly below the floating gate 8. The first and second silicon oxide films 6 and 7 may be replaced with silicon oxinitride films or silicon nitride oxide films. The second section 14 is located over a portion of the channel region 5 in the integrated first and second silicon oxide films 6 and 7 and is arranged to cover first and second side wall spacers (hereinafter simply called "spacers") 12 and 13 (to be described later), which are formed adjacent to the side wall of the second silicon oxide film 7. The second section 14 extends over a portion of the drain region 4. In the first embodiment, doped polysilicon is used for the floating and control gates 8 and 9 and the first and second spacers 12 and 13.

The second section 14 and the first and second spacers 12 and 13 serve as a select gate 10 which, together with the source region 3 and drain region 4, forms a select transistor 11. This select transistor 11 allows each associated memory cell 2 to self-select the ON/OFF state.

As shown in FIG. 5, the first and second spacers 12 and 13 are arranged to secure a certain channel length (length between the floating gate 8 and the drain region 4) of the select transistor 11. The first spacer 12 is located on the first and second silicon oxide films 6 and 7 and directly adjacent to the side wall of the second silicon oxide film 7. The first spacer 12 has a narrower width at the top portion than at the bottom portion. The second spacer 13 is located on the first and second silicon oxide films 6 and 7 and directly adjacent to the first spacer 12. The second spacer 13 has a narrower width at the top portion than at the bottom portion.

The select gate 10 includes a thick film section 15, which is formed by a portion of the second section 14 and the first and second spacers 12 and 13, and a thin film section 16 formed by the remaining portion of the second section 14. This thin film section 16 has a sufficient thickness T1 (approximately 200 nm) to pass the ionized impurity that is to be doped to form the drain region 4. The thin film section 16 also has a width for the margin that corresponds to the alignment precision of 0.1 to 0.2 μm of the etching mask. The thick film section 15 has a thickness T2 to inhibit the passing of the ionized impurity.

Figure 6A:
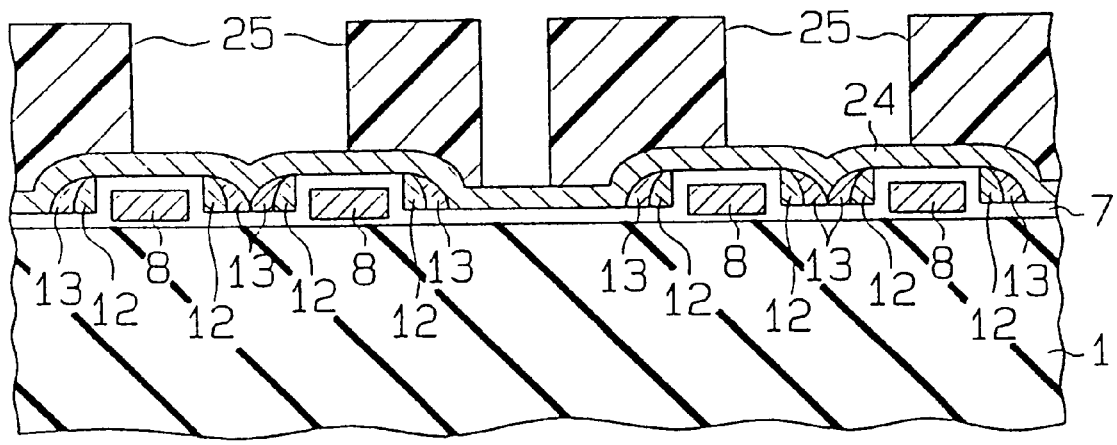
FIGS. 6A and 6B are cross-sectional views showing steps of forming a control gate and drain region in the memory cell array.
Figure 6B:
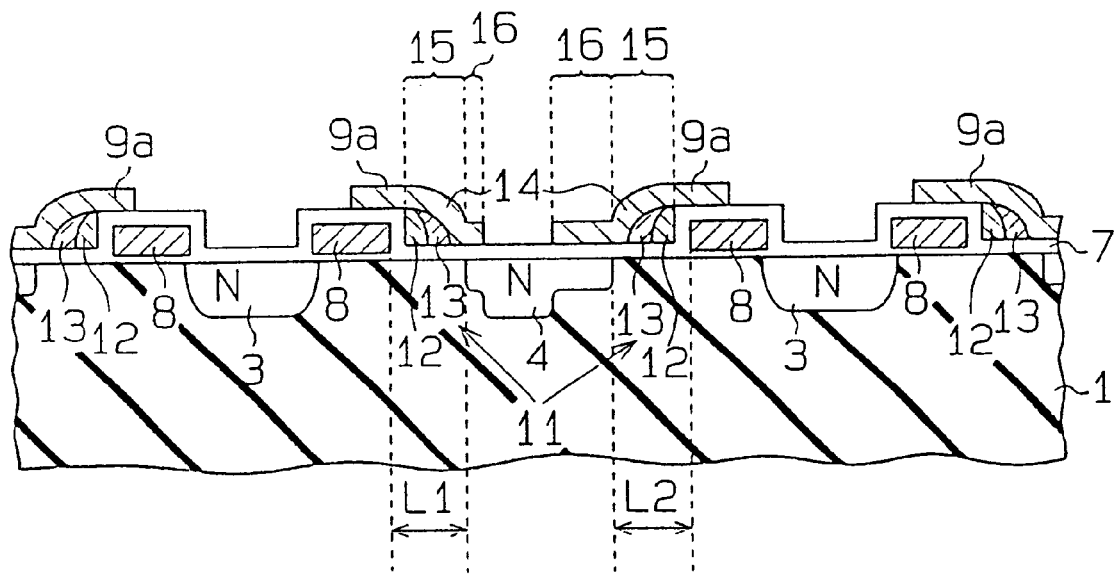

Assume that an etching mask 25 for forming the control gate 9 is off the optimal position as shown in FIG. 6A. After etching, the lengths of two thin film sections 16 between adjoining memory cells are different from each other as shown in FIG. 6B. However, the offset of the mask 25 within the alignment precision of 0.1 to 0.2 μm allows the width, L6, of the thick film section 15 to be kept constant. The thick film section 15 is used as a mask and a portion of ionized impurity passes the thin film section 16, forming the drain region 4 in the surface of the silicon substrate 1. That is, a portion of the drain region 4 is also formed under the thin film section 16. This permits the drain region 4 to be always self-aligned at a given position, regardless of the length of the thin film section 16. The channel lengths L1 and L2 of the select transistors 11 therefore are always the same. The channel lengths L1 and L2 are equal to the length L6 of the thick film section 15. It is therefore possible to obtain miniaturized split gate type memory cells 2 irrespective of the relatively low mask alignment precision. This feature contributes to improving the integration of a flash EEPROM.

Figure 7:
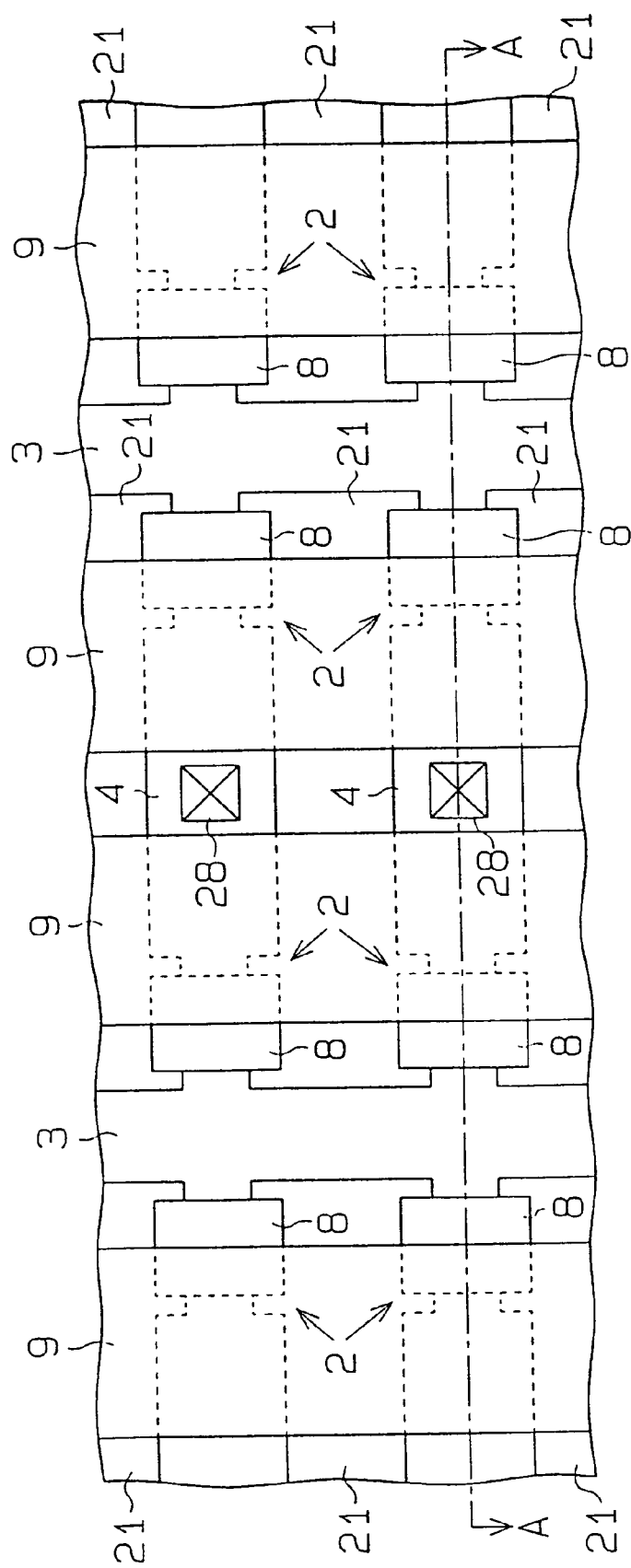
FIG. 7 is a plan view of the memory cell array.
Figure 8A:
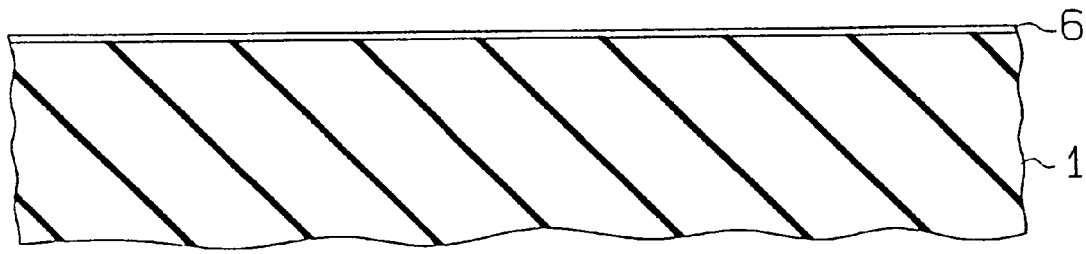
FIGS. 8A through 8K are cross-sectional views showing individual steps in a method for manufacturing the memory cell array in FIG. 4.
Figure 8B:
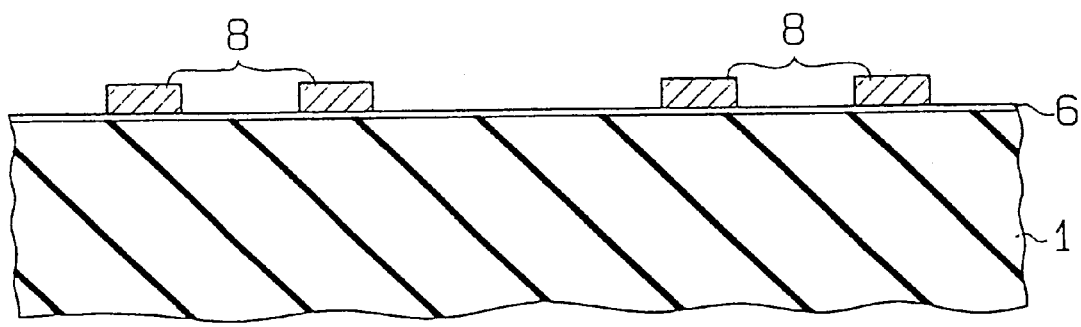
Figure 8C:
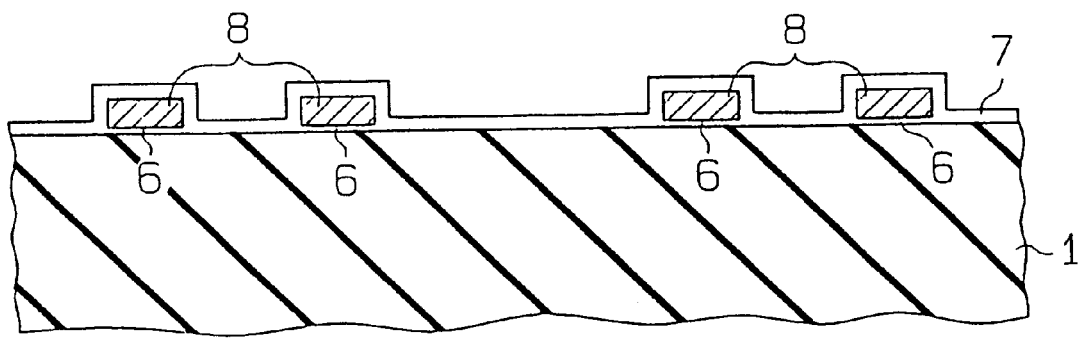
Figure 8D:
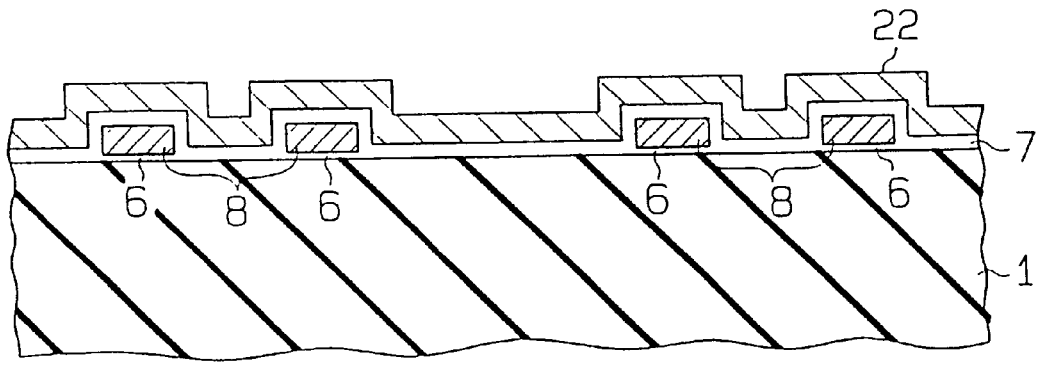
Figure 8E:
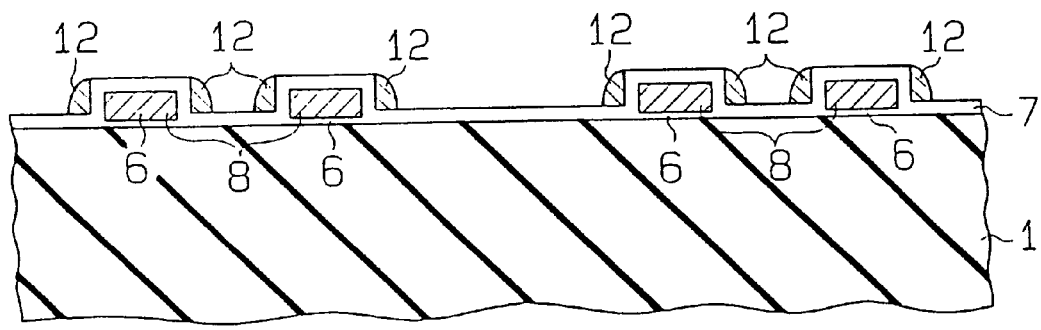
Figure 8F:
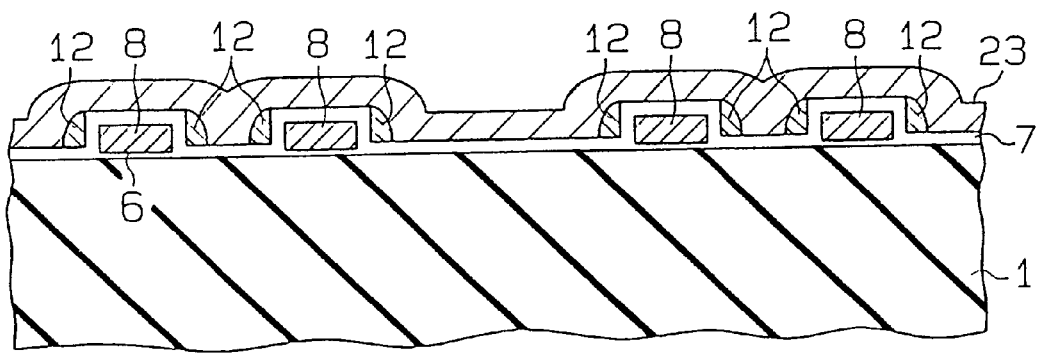
Figure 8G:
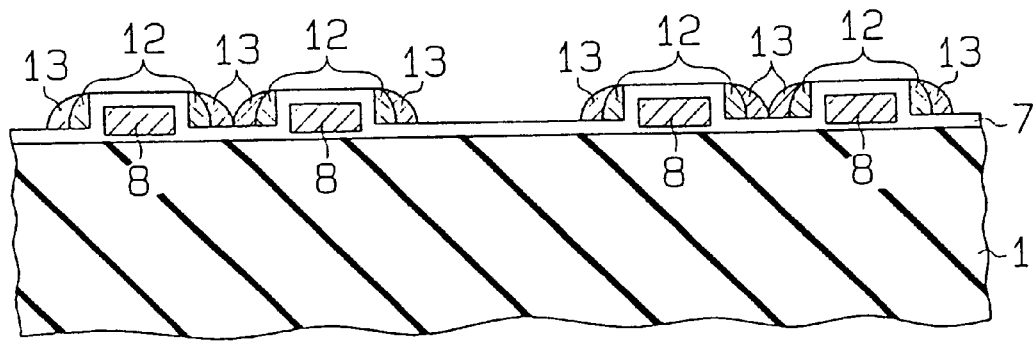
Figure 8H:
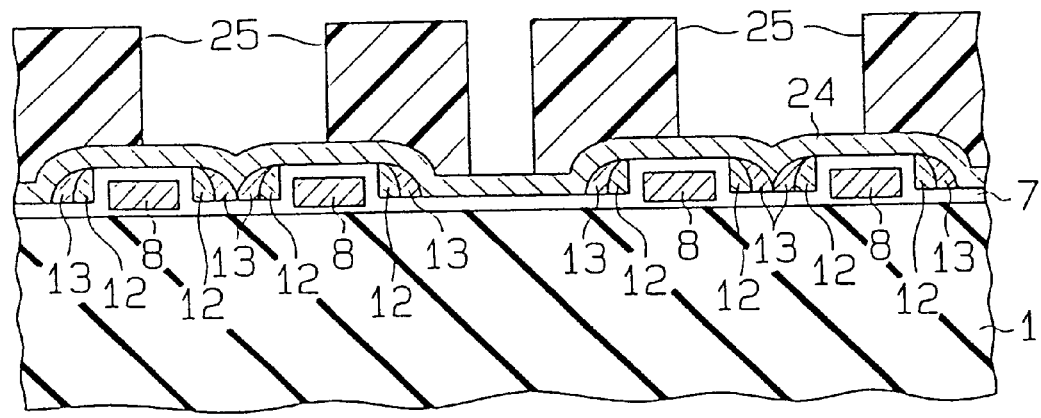
Figure 8I:
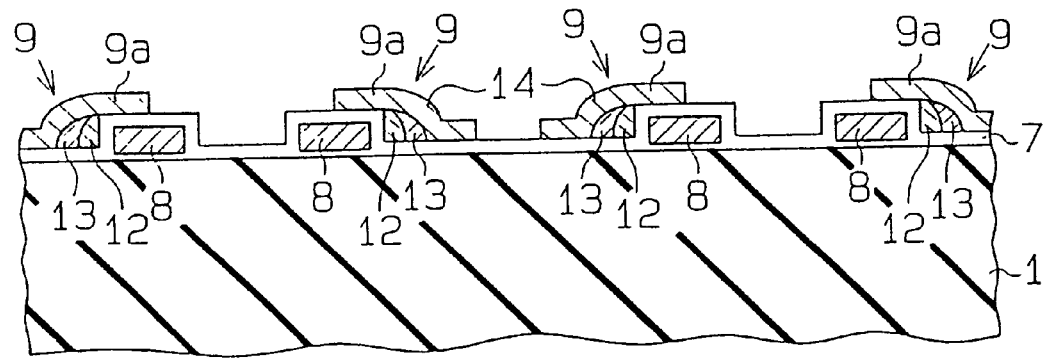
Figure 8J:
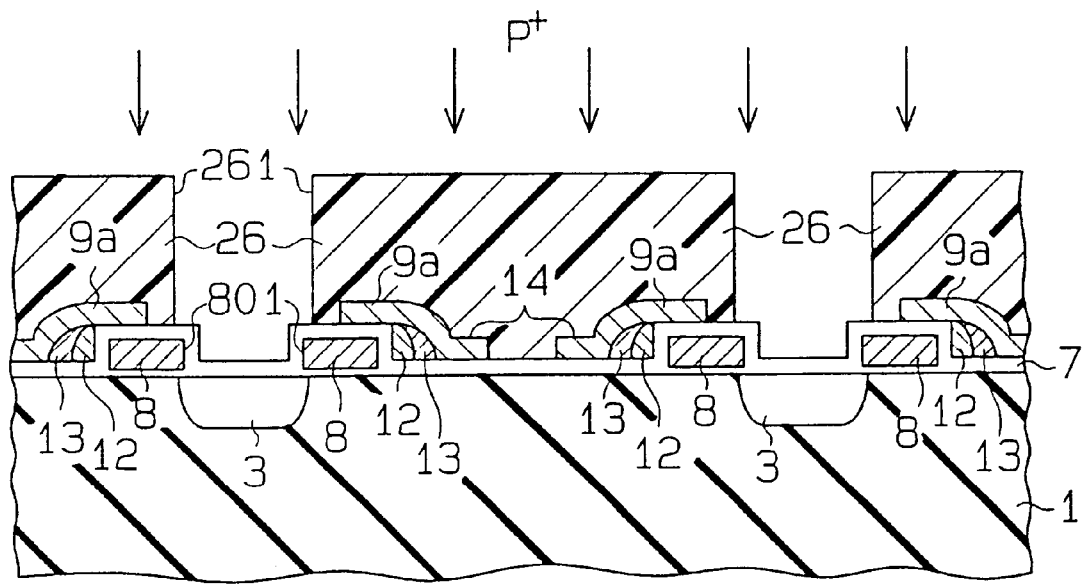
Figure 8K:
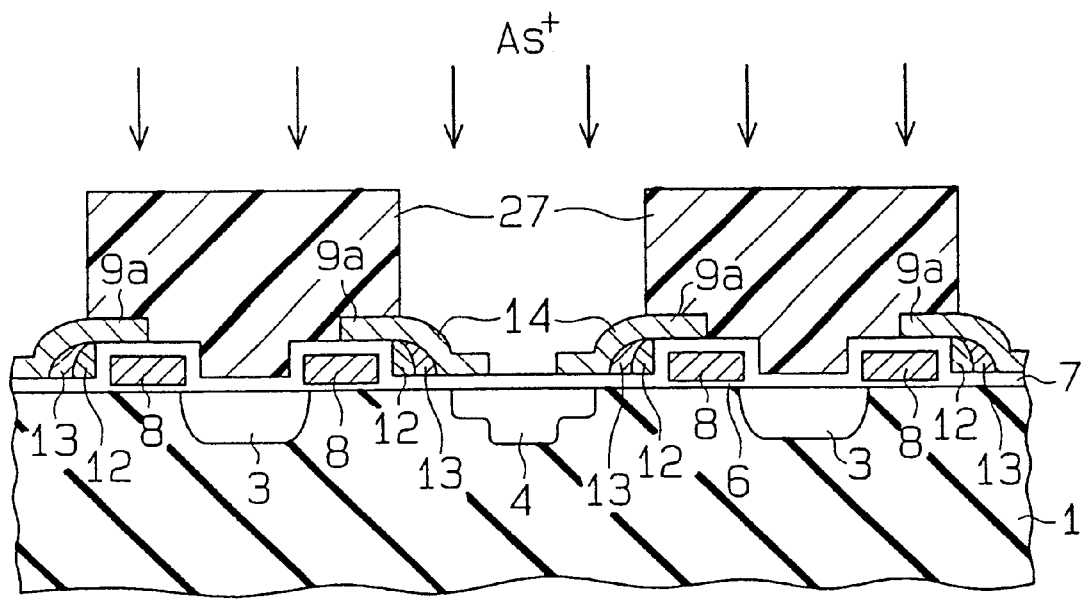

FIG. 7 is a plan view showing the memory cell array of the flash EEPROM according to the first embodiment. FIG. 4 shows a cross section along the line A—A in FIG. 7. A field insulating layer 21 is formed on the silicon substrate 1 for device isolation between the memory cells 2. The individual memory cells 2 arranged in the direction from one side of the drawing sheet to the other share the source region 3 and control gate electrode 9. The control gate electrode 9 serves as a word line to be discussed later. The individual drain regions 4 corresponding to the associated memory cells 2 are connected with bit-line contacts 28 to bit lines, which will be discussed later.

A method for fabricating the memory cells according to the first embodiment will be now described with reference to FIGS. 8A to 8K.

Step 1 (see FIG. 8A): The field insulating layer 21 (not shown) is locally formed on the silicon substrate 1 by LOCOS (Local Oxidation on Silicon) as selective oxidation, excluding the area where a device is to be formed. Next, the first silicon oxide film 6 is formed approximately 10 to 15 nm thick on the device region on the silicon substrate 1 by thermal oxidation.

Step 2 (see FIG. 8B): After a doped polysilicon film is formed about 200 nm thick on the first silicon oxide film 6, the floating gate electrode 8 is formed by the ordinary photolithography. The doped polysilicon film is formed by any of the three methods. The first method (1) is LPCVD (Low Pressure Chemical Vapor Deposition) in which case impurity-containing gas is mixed. In the second method (2), after a non-doped polysilicon film is formed by LPCVD, an impurity diffusion source layer is formed on the non-doped polysilicon film by using $POCl_3$ or the like. Then, the impurity is diffused into the non-doped polysilicon film from the diffusion source layer. In the third method (3), after a non-doped polysilicon film is formed by LPCVD, ionized impurity is implanted in the non-doped polysilicon film.

Step 3 (see FIG. 8C): The second silicon oxide film 7 is formed 30 to 40 nm thick on the floating gate electrode 8 and the silicon oxide film 6 by thermal oxidation or LPCVD or by both methods. As a result, the first and second silicon oxide films 6 and 7 are stacked one on the other to be integral.

Step 4 (see FIG. 8D): A doped polysilicon film 22 is formed approximately 300 nm thick on the surface of the device which has undergone the step 3.

Step 5 (see FIG. 8E): The doped polysilicon film 22 is etched back by the thickness (approximately 300 nm) without a mask by RIE (Reactive Ion Etching). Consequently, a portion of the doped polysilicon film 22 directly adjoining to both side walls of the second silicon oxide film 7 remains as the first spacer 12 on the first and second silicon oxide films 6 and 7. This first spacer 12 has a maximum width L3 (see FIG. 5) of approximately 0.15 μm at its bottom portion. Unless the conditions for forming the doped polysilicon film 22 and the RIE conditions are changed, the maximum width of the first spacer 12 is kept constant (about 0.15 μm). This shows the high controllability and reproducibility of the maximum width of the first spacer 12. By controlling the etch-back amount, the doped polysilicon film 22 may be made to remain thin on the entire surface of the first and second silicon oxide films 6 and 7 as well as on both side walls of the second silicon oxide film 7.

Step 6 (see FIG. 8F): A doped polysilicon film 23 is formed approximately 300 nm thick on the surface of the device which has undergone the step 5.

Step 7 (see FIG. 8G): The doped polysilicon film 23 is etched back by the thickness (approximately 300 nm) in a maskless manner by RIE. As a result, a portion of the doped polysilicon film 23 adjoining to the first spacer 12 remains as the second spacer 13 on the first and second silicon oxide films 6 and 7. This second spacer 13 has a maximum width L4 of approximately 0.15 μm at its bottom portion. As long as the conditions for forming the doped polysilicon film 23 and the RIE conditions remain the same, the maximum width of the second spacer 13 is kept constant (about 0.15 μm). This shows the high controllability and reproducibility of the maximum width of the second spacer 13.

Step 8 (see FIG. 8H): A doped polysilicon film 24 is formed approximately 200 nm thick on the entire surface of the device which has undergone the step 7. Next, after a resist is coated on the doped polysilicon film 24, the etching mask 25 is formed by the ordinary photolithography.

Step 9 (see FIG. 8I): The doped polysilicon film 24 is patterned by anisotropic etching using the mask 25 to form the control gate electrode 9. At this time unnecessary first and second spacers 12 and 13 are removed together. Then, the mask 25 is removed. If the mask 25 is formed slightly off the optimal position in this process, the width of the thin film section 16 of the select transistor 10 varies (see FIGS. 6A and 6B). Within the alignment precision (approximately 0.1 to 0.2 μm) of the mask 25, however, the thick film section 15 is never removed, while the thin film section 16 as a margin may not be formed. The maximum width of the thick film section 15 is determined by the maximum widths L3 and L4 of the first and second spacers 12 and 13 and the thickness of the doped polysilicon film 24. Unless the conditions for forming the first and second spacers 12 and 13 (doped polysilicon films 22 and 23) and the doped polysilicon film 24 and the RIE conditions are altered, the maximum width L6 of the thick film section 15 is always kept constant. This shows the high controllability and reproducibility of the maximum width L6 of the thick film section 15. In the first embodiment, the maximum widths of the first and second spacers 12 and 13 are 0.15 μm, and the thickness of the doped polysilicon film 24 is 200 nm, so that the maximum width of the thick film section 15 is 0.5 μm.

Step 10 (see FIG. 8J): After a resist is coated on the surface of the device which has undergone the step 9, a mask 26 for ion implantation is formed by the ordinary photolithography. A dose amount of approximately 1 to $4 \times 10^{15}$ atoms/cm$^2$ of phosphorus ions (P$^+$) is implanted into the surface of the substrate 1 by the energy of about 40 keV using the ordinary ion implantation method, and the source region 3 is formed. Then, the mask 26 is removed. The mask 26 has to be formed to cover the portion in the substrate 1 where a drain region 4 is to be defined. Additionally, the mask 26 has to be formed such that each side wall 261 of the mask 26 does not approach a side wall 801 of each floating gate electrode 8 facing the source region 3. Consequently, the source region 3 is defined between two adjoining floating gate electrodes 8.

Step 11 (see FIG. 8K): After a resist is coated on the surface of the device that has undergone the step 10, a mask 27 for ion implantation is formed by the ordinary photolithography. The mask 27 should be formed to cover at least the source region 3. A dose amount of approximately 1 to $4 \times 10^{15}$ atoms/cm$^2$ of arsenic ions (As$^+$) is implanted into the surface of the substrate 1 by the energy of about 500 keV using the ordinary ion implantation method. The condition for implanting arsenic ions is altered in accordance with a thickness variation of the thin film section 16. The projection range of the arsenic ions is approximately 0.3 μm. Therefore, some of the arsenic ions pass the thin film section 16 and the integrated first and second silicon oxide films 6 and 7 and reach inside the silicon substrate 1, thus forming the drain region 4. Another portion of the arsenic ions does not reach the silicon substrate 1 and stops inside the thick film section 15. As a result, the drain region 4 is defined in a self-aligned manner between two adjoining thick film sections 15. The channel length of each select transistor 11 becomes the same as the maximum width L6 of the thick film section 15. Thereafter, the mask 27 is removed, which completes the memory cell array.

Figure 9:
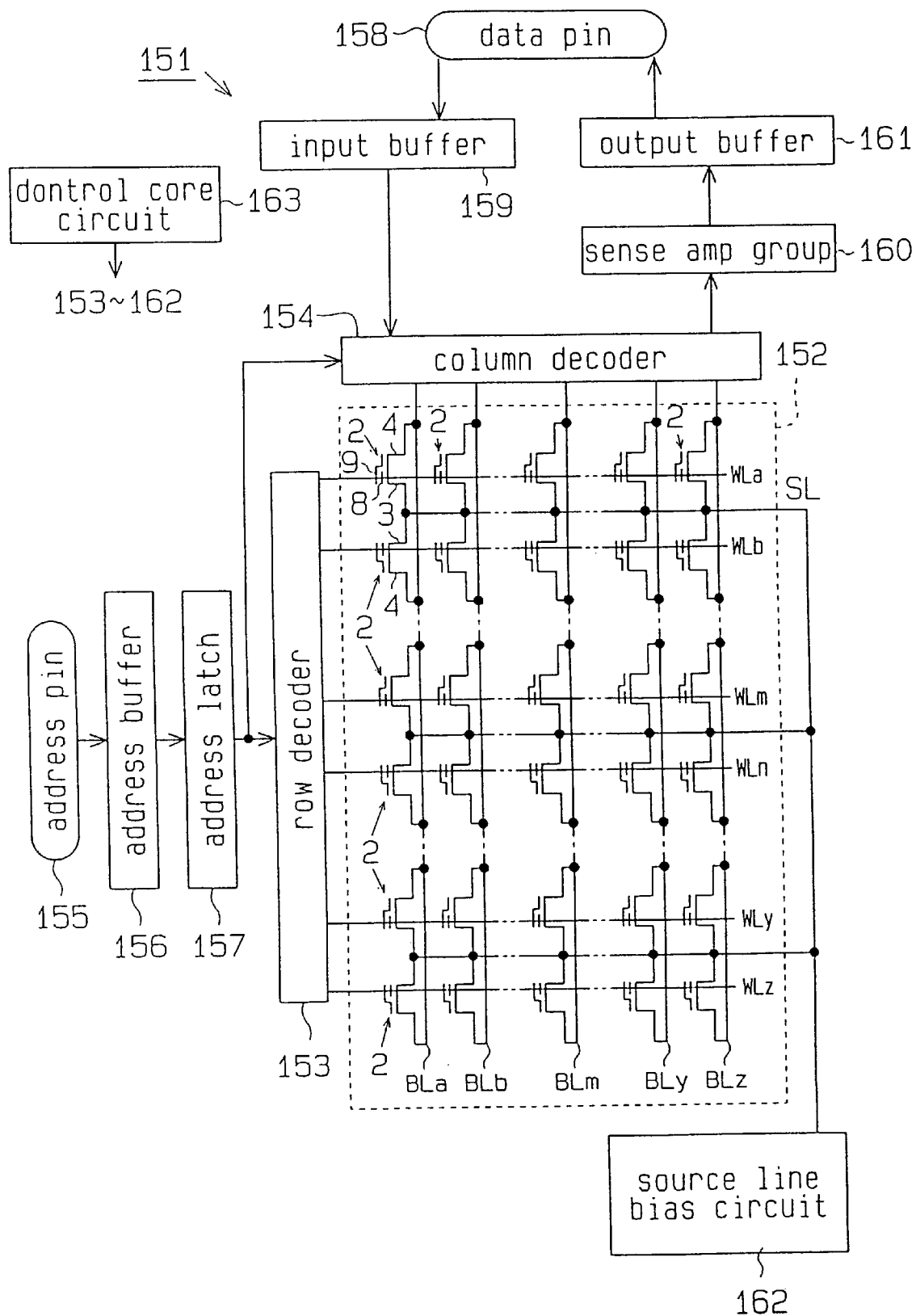
FIG. 9 is a block diagram showing a flash EEPROM.

FIG. 9 is a block diagram showing a flash EEPROM 151 according to the first embodiment. A memory cell array 152 has a plurality of split gate type memory cells 2 arranged in a matrix form. The memory cells 2 in each row share the control gate electrode 9, and those control gate electrodes 9 form word lines WLa to WLz, respectively. The memory cells 2 in each column have the drain region 4, and those drain regions 4 are respectively connected to bit lines BLa to BLz. The source regions 3 of all the memory cells 2 are commonly connected to a source line SL. The individual word lines WLa–WLz are connected to a row decoder 153, and the individual bit lines BLa–BLz are connected to a column decoder 154.

A row address signal and a column address signal are supplied to an address pin 155 from an external device. The address pin 155 transfers the row and column address signals to an address latch 157 via an address buffer 156. The address latch 157 transfers the row address signal to the row decoder 153, and the column address signal to the column decoder 154. The row decoder 153 selects one of the word lines WLa–WLz in response to the row address signal, and controls the voltage to be applied to the selected word line in accordance with each of the operation modes (write mode, erase mode and read mode) shown in FIG. 10. The column decoder 154 selects one of the bit lines BLa–BLz in response to the column address signal, and controls the voltage to be applied to the selected bit line in accordance with each operation mode. The source line SL is connected to a source line bias circuit 162, which controls the potential at the source line SL in accordance with each operation mode.

A data signal is supplied to a data pin 158 from the external device. The data pin 158 transfers the data signal to the column decoder 154 via an input buffer 159. In response to the data signal, the column decoder 154 controls the voltage to the selected one of the bit lines BLa–BLz. A data signal read from an arbitrary memory cell 2 is supplied to the column decoder 154 via the associated one of the bit lines BLa–BLz. The column decoder 154 connects the selected bit line to a plurality of sense amplifiers (not shown) included in a sense amplifier group 160, and transfers the data signal to those sense amplifiers. The sense amplifier group 160 discriminates the data signal and supplies it to the data pin 158 via an output buffer 161. The individual circuits 153–162 are connected to a control core circuit 163 which controls those circuits.

Second Embodiment

Figure 11:
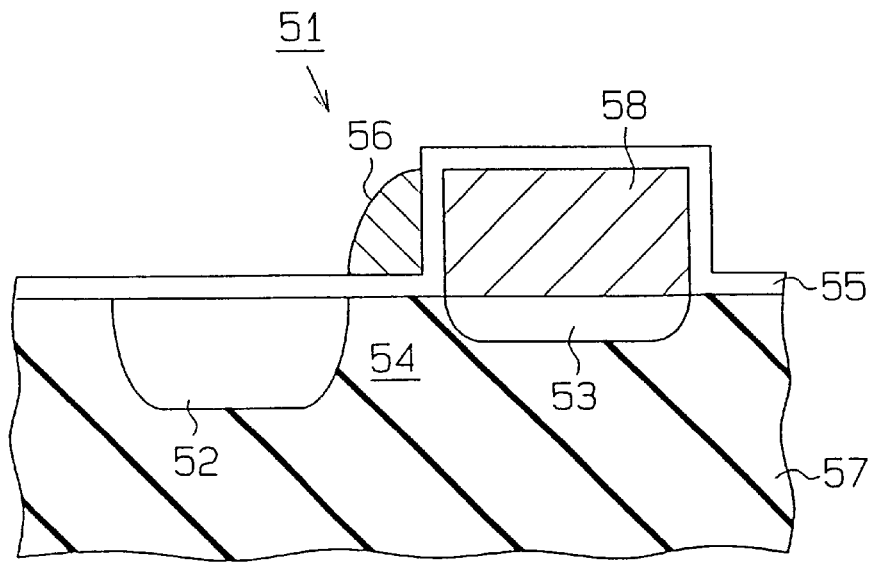
FIG. 11 is a cross-sectional view of an MOS transistor according to the second embodiment.

The second embodiment of this invention as adapted to an MOS transistor will be now described with reference to FIG. 11. FIG. 11 presents a cross-sectional view showing an MOS transistor 51 according to the second embodiment. The MOS transistor 51 has a P-type single crystalline silicon substrate 57, or the like. Formed on the substrate 57 are a source region (or a drain region) 52 and a drain region (or a source region) 53 with a channel region 54 defined therebetween. A gate electrode 56 is formed over the channel region 54 via a silicon oxide film 55 serving as an insulating layer. Formed on the drain region 53 is a polysilicon layer 58 as a projection in which an impurity having an N-type conductivity, or the like, is doped. This polysilicon layer 58 is used as an N-type impurity diffusion source. The gate electrode 56 is a side wall spacer, which is directly adjacent to the side wall of the silicon oxide film 55, which covers the doped polysilicon layer 58. The MOS transistor 51 is formed by the source and drain regions 52 and 53, the channel region 54, the silicon oxide film 55 and the gate electrode 56.

To fabricate the MOS transistor 51, the doped polysilicon layer 58 is formed on the silicon substrate 57 first. Next, the impurity is diffused into the silicon substrate 57 from the doped polysilicon layer 58 to form the drain region 53. Subsequently, the silicon oxide film 55 is formed on the surface of the device which has been acquired by the above step, after which a doped polysilicon film is formed on the silicon oxide film 55. Then, the doped polysilicon film is etched back in a maskless manner by RIE. As a result, a portion of the doped polysilicon film directly adjacent to the side wall of the silicon oxide film 55 which covers the doped polysilicon layer 58 remains as a side wall spacer. This spacer becomes the gate electrode 56 having a relatively narrow width. The controllability and reproducibility of this width are high as those of the first embodiment. It is therefore possible to easily form the miniaturized MOS transistor 51. With the gate electrode 56 and the doped polysilicon layer 58 used as masks, impurity ions are implanted into the silicon substrate 57 to form the source region 52, which completes the MOS transistor 51.

Third Embodiment

Figure 12:
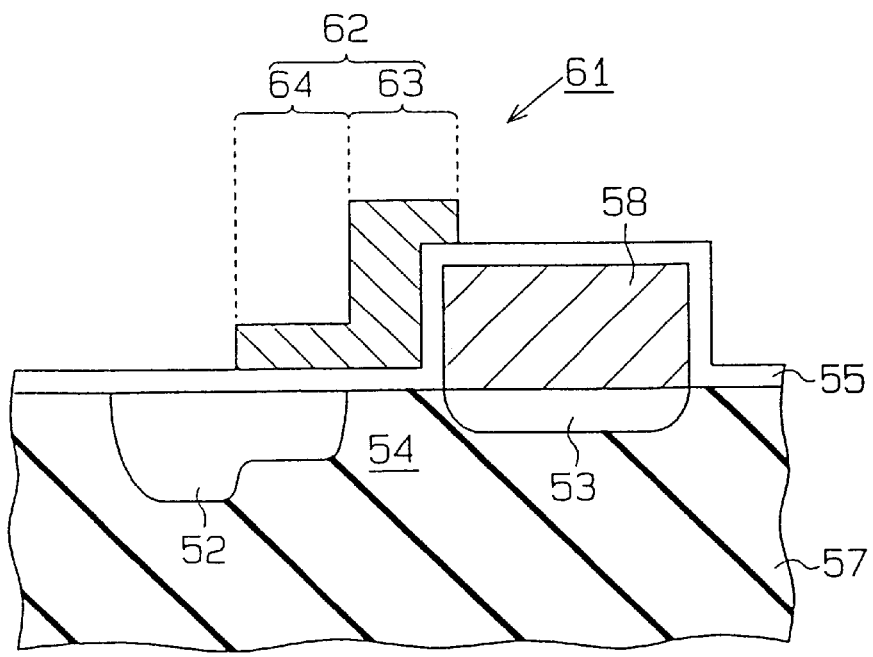
FIG. 12 is a cross-sectional view of an MOS transistor according to the third embodiment.

The third embodiment of this invention as adapted to an MOS transistor will be now described with reference to FIG. 12. To avoid redundancy, like or same reference numerals are given to those components that are the same as the corresponding components of the second embodiment. FIG. 12 presents a cross-sectional view showing an MOS transistor 61 according to the third embodiment. The MOS transistor 61 has a silicon substrate 57, a source region (or a drain region) 52, a drain region (or a source region) 53, a channel region 54, a silicon oxide film 55 and a gate electrode 62. The gate electrode 62 includes a thin film section 64, which is formed on a portion of the source region 52, and a thick film section 63 adjacent to the side wall of the silicon oxide film 55, which covers a doped polysilicon layer 58. The thin film section 64 has a sufficient thickness to pass impurity ions, which are implanted to form the source region 52.

To fabricate the MOS transistor 61, the doped polysilicon layer 58 is formed on the silicon substrate 57 first. Next, the impurity is diffused into the silicon substrate 57 from the doped polysilicon layer 58 to form the drain region 53. Subsequently, the silicon oxide film 55 is formed on the surface of the device, which has been acquired by the above step, after which a doped polysilicon film is formed on the silicon oxide film 55. The doped polysilicon film is patterned by anisotropic etching using a mask to form the gate 62 of the desired shape. With the gate electrode 62 and the doped polysilicon layer 58 used as masks, impurity ions are to be implanted into the surface of the silicon substrate 57. At this time, some of the impurity ions pass the thin film section 64 and the silicon oxide film 55 and reach the surface of the silicon substrate 57, thus forming the source region 52. That is, the source region 52 is also formed under the thin film section 64. The other impurity ions do not reach the silicon substrate 57 and stop inside the thick film section 63. This allows the thick film section 63 to form the source region 52 in a self-aligned manner. The channel length of the MOS transistor 61 becomes the same as the width of the thick film section 63. The controllability and reproducibility of the width of this thick film section 63 are extremely high, so that the channel length of the MOS transistor 61 is always kept constant. According to the third embodiment, therefore, it is possible to easily manufacture the miniaturized MOS transistor 61 as with the first and second embodiments.

Fourth Embodiment

Figure 13:
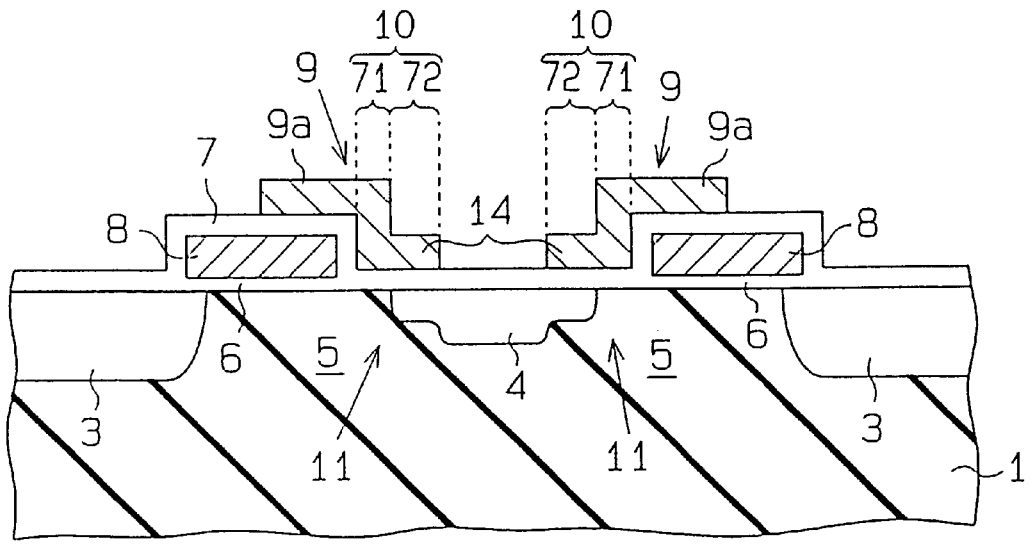
FIG. 13 is a cross-sectional view showing the memory cell array of a flash EEPROM according to the fourth embodiment.
Figure 14:
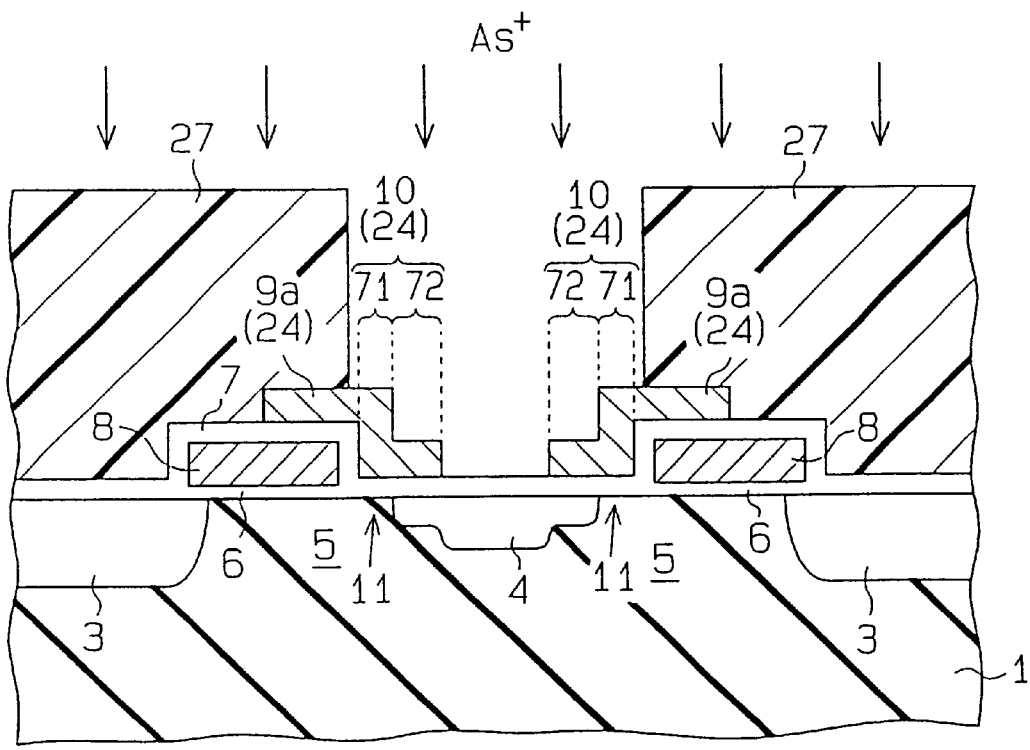
FIG. 14 is a cross-sectional view showing a step of forming a drain region in the memory cell array in FIG. 13.

A description will be now given of the fourth embodiment of this invention as adapted to a flash EEPROM that uses split gate type memory cells with reference to FIGS. 13 and 14. To avoid redundancy, like or same reference numerals are given to those components that are the same as the corresponding components of the first embodiment. FIG. 13 is a cross-sectional view showing the memory cell array of the flash EEPROM according to the fourth embodiment. The fourth embodiment differs from the first embodiment in that the first and second spacers 12 and 13 are not formed, and the select gate 10 is formed by the second section 14 of the control gate 9. The select gate 10 includes a thick film section 71, which is directly adjacent to the side wall of the second silicon oxide film 7 that covers the floating gate electrode 8, and a thin film section 72 formed over the drain region 4. This thin film section 72 has a sufficient thickness to pass the impurity ions that are to be implanted to form the drain region 4. In the fourth embodiment, the width of the thick film section 71 is narrower than that of the thick film section 15 of the first embodiment by the omitted first and second spacers 12 and 13. It is therefore possible to obtain more miniaturized split gate type memory cells, thus contributing to the improvement of the integration of a flash EEPROM.

As shown in FIG. 14, in the step of forming the drain region 4 in the fourth embodiment, some arsenic ions pass the thin film section 72 and the integrated first and second silicon oxide films 6 and 7 and reach inside the silicon substrate 1, thus forming the drain region 4. The other arsenic ions stop inside the thick film section 71 without reaching the silicon substrate 1. As a result, the drain region 4 is defined between the adjoining thick film sections 71. This allows the thick film section 71 to form the drain region 4 in a self-aligned manner. The channel length of the select transistor 11 becomes the same as the width of the thick film section 71. The controllability and reproducibility of the width of this thick film section 71 are very high, so that the channel length of the select transistor 11 is always kept constant.

Fifth Embodiment

Figure 15:
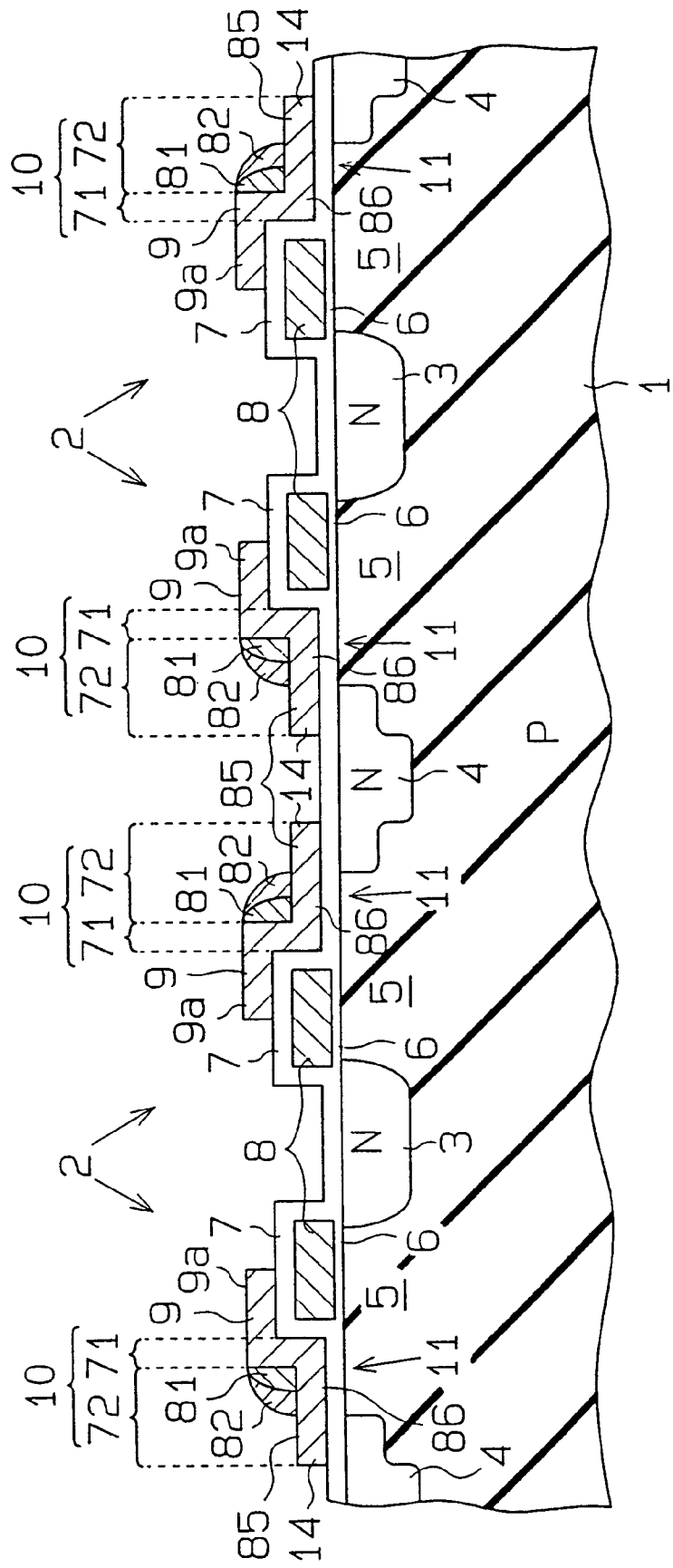
FIG. 15 is a cross-sectional view showing the memory cell array of a flash EEPROM according to the fifth embodiment.
Figure 16A:
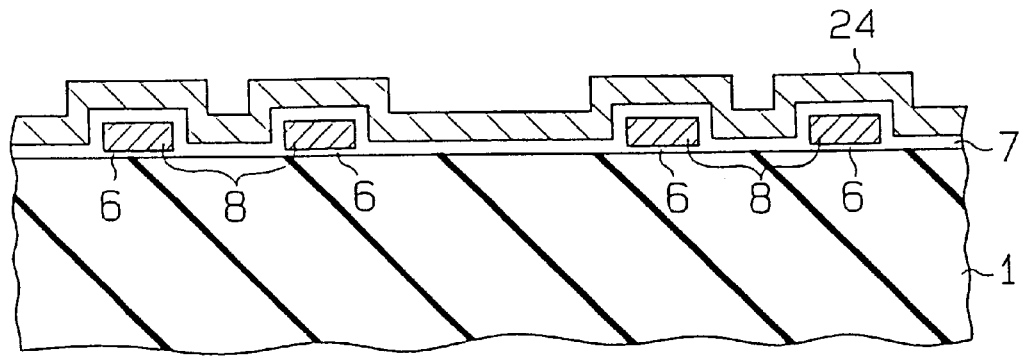
FIGS. 16A through 16I are cross-sectional views showing individual steps in a method for manufacturing the memory cell array in FIG. 15.
Figure 16B:
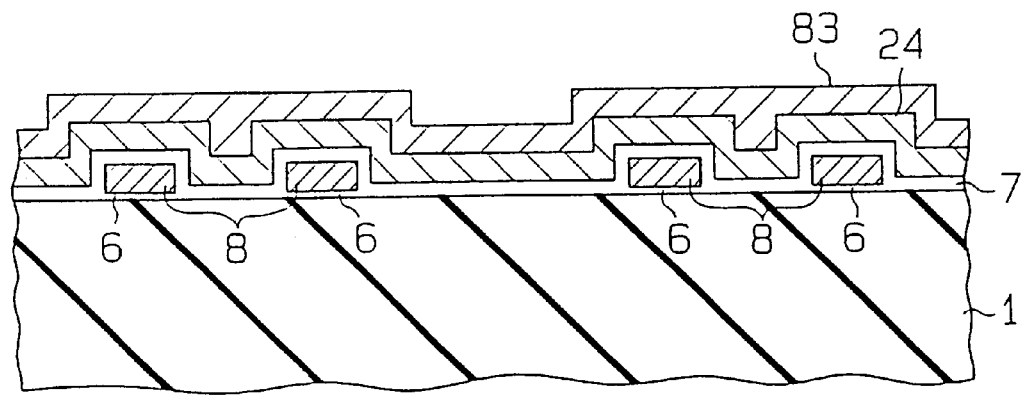
Figure 16C:
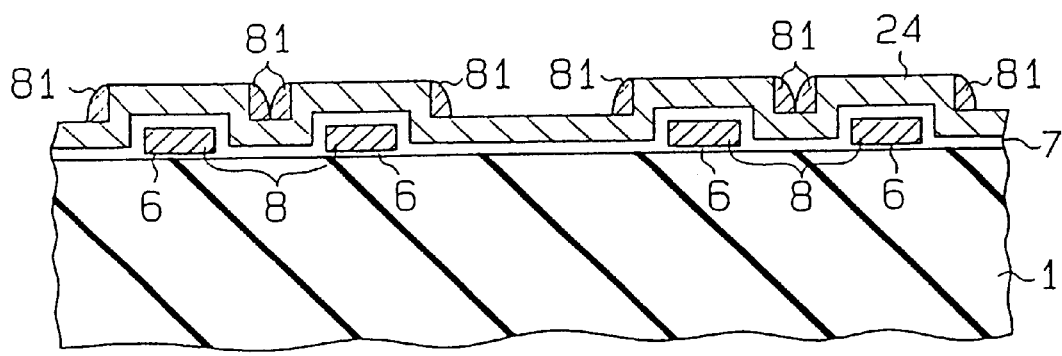
Figure 16D:
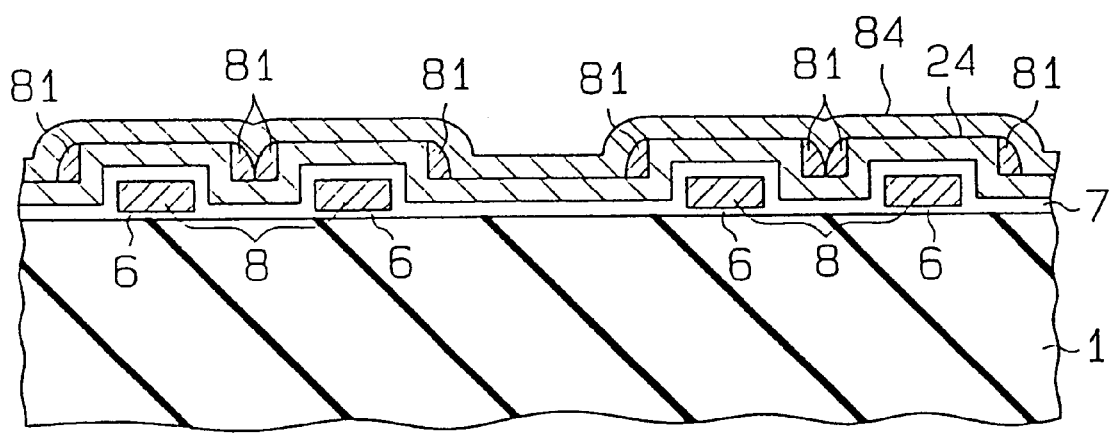
Figure 16E:
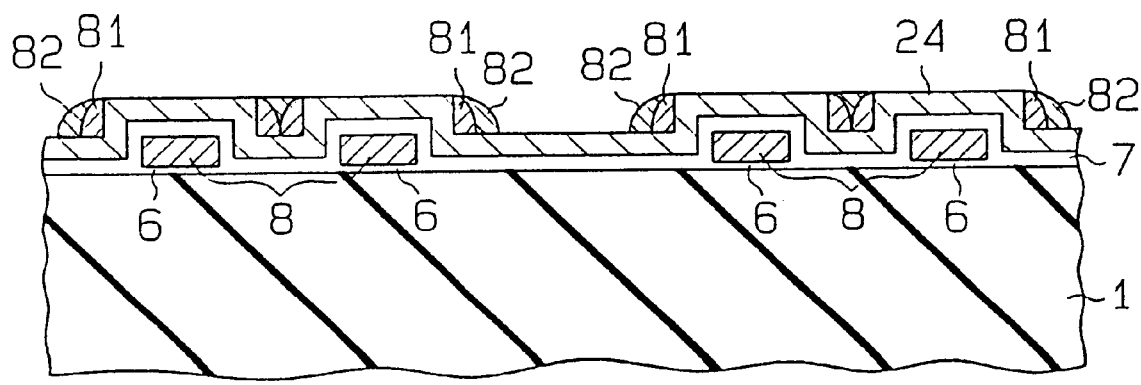
Figure 16F:
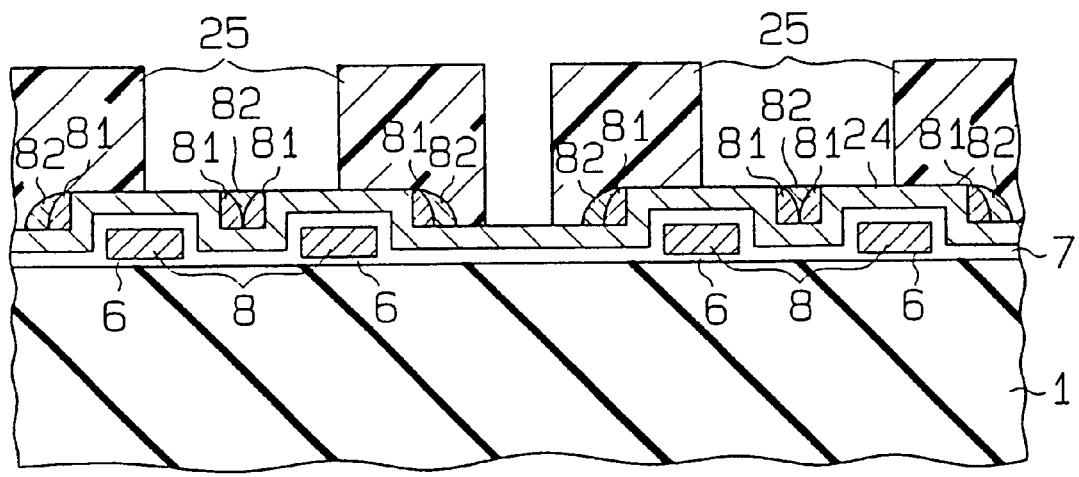
Figure 16G:
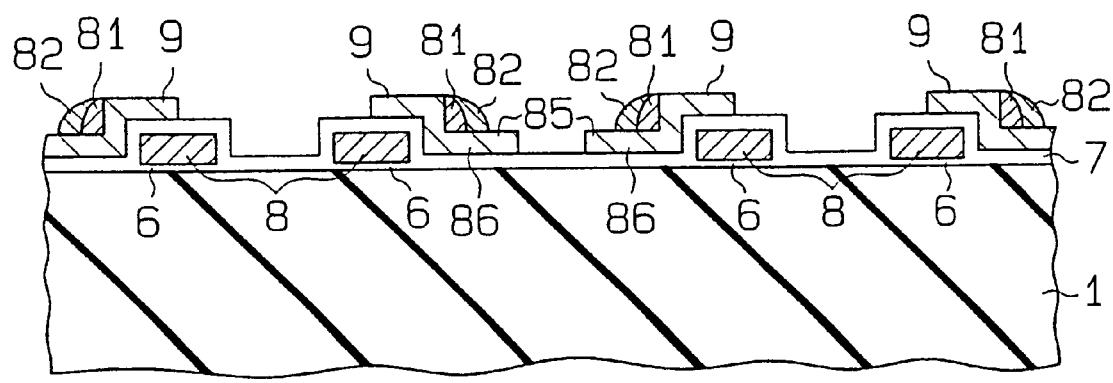
Figure 16H:
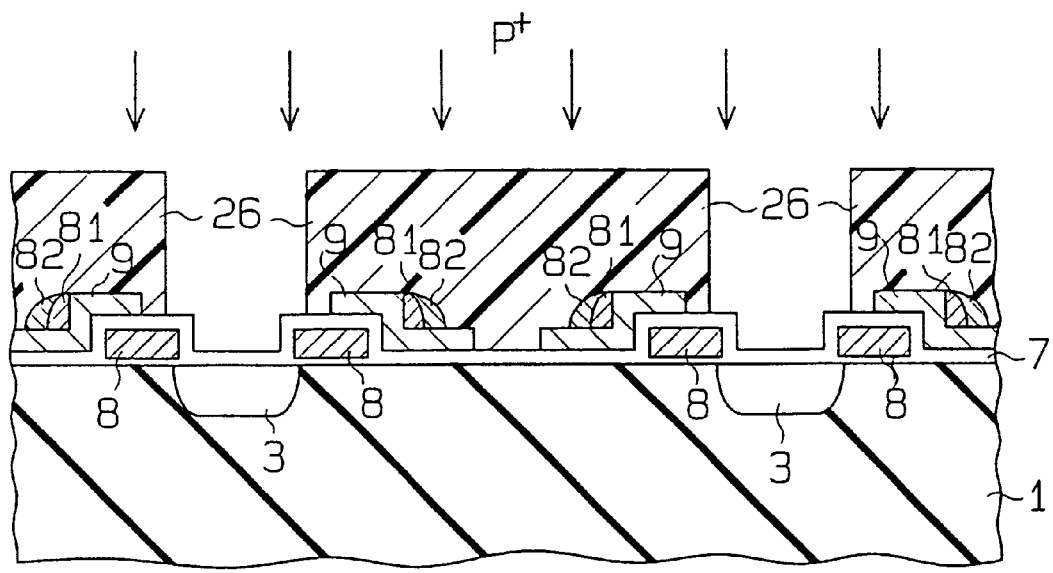
Figure 16I:
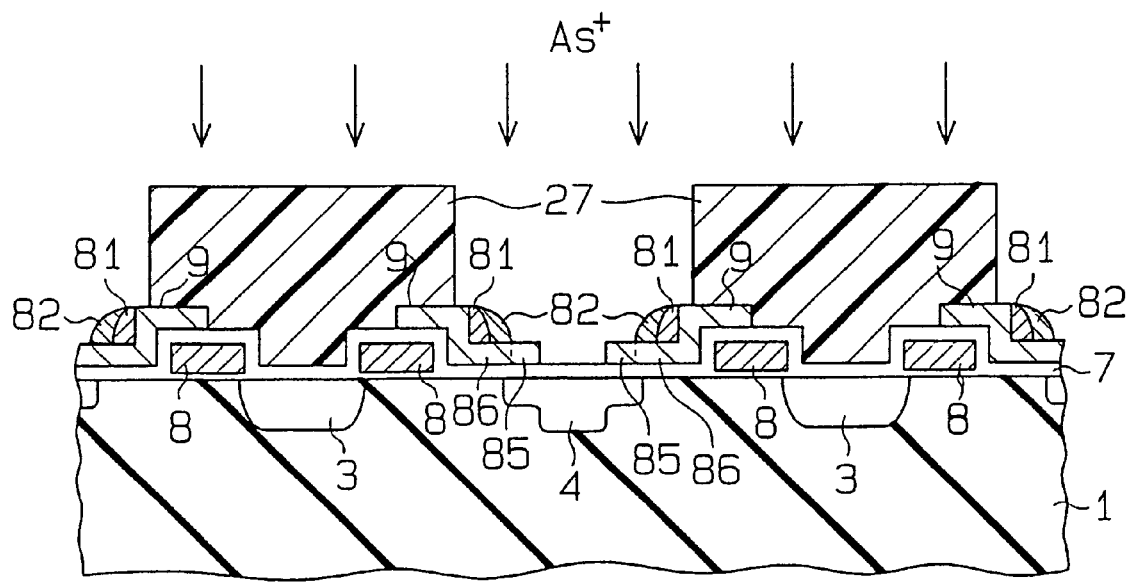

A description will be now given of the fifth embodiment of this invention as adapted to a flash EEPROM that uses split gate type memory cells with reference to FIGS. 15 and 16A through 16I. To avoid redundancy, like or same reference numerals are given to those components that are the same as the corresponding components of the fourth embodiment. FIG. 15 is a cross-sectional view showing a part of the memory cell array of the flash EEPROM according to the fifth embodiment. The fifth embodiment differs from the fourth embodiment in that first and second spacers 81 and 82 are formed on the thin film section 72 and are adjacent to the thick film section 71. The first and second spacers 81 and 82 are not included in the select gate 10. Therefore, the first and second spacers 81 and 82 may not be conductive, and a silicon oxide film is used for those spacers in the fifth embodiment. Besides the silicon oxide film, a silicon nitride film, a doped polysilicon film and a non-doped polysilicon film, which are formed by CVD or PVD (Physical Vapor Deposition) may be used as well. The thin film section 72 includes the base section 86 where the first and second spacers 81 and 82 are located, and an extending section 85 where those spacers are not located. The extending section 85 has a length for a margin corresponding to the mask alignment precision of 0.1 to 0.2 μm.

A method for fabricating the memory cells according to the fifth embodiment will be now described with reference to FIGS. 8A to 8C and FIGS. 16A to 16I.

Step 1 (see FIG. 8A) to step 3 (see FIG. 8C) are the same as the steps 1 to 3 of the first embodiment. Through those steps, the integrated first and second silicon oxide films 6 and 7 and the gate electrode 8 are formed on the silicon substrate 1.

Step 4 (see FIG. 16A): A doped polysilicon film 24 is formed approximately 200 nm thick on the surface of the device which has undergone the step 3.

Step 5 (see FIG. 16B): A silicon oxide film 83 is formed approximately 300 nm thick on the doped polysilicon film 24 by LPCVD.

Step 6 (see FIG. 16C): The silicon oxide film 83 is etched back by its thickness (approximately 300 nm) in a maskless manner by RIE. As a result, a portion of the silicon oxide film 83 which is directly adjacent to both side walls of the doped polysilicon film 24 remains as the first spacer 81 on the doped polysilicon film 24. This first spacer 81 has the maximum width of approximately 0.15 μm at its bottom portion.

Step 7 (see FIG. 16D): A silicon oxide film 84 is formed approximately 300 nm thick on the surface of the device, which has undergone the step 6, by LPCVD.

Step 8 (see FIG. 16E): The silicon oxide film 84 is etched back by its thickness (approximately 300 nm) in a maskless manner by RIE. As a result, a portion of the silicon oxide film 84 which is directly adjacent to the first spacer 81 remains as the second spacer 82 on the doped polysilicon film 24. This second spacer 82 has the maximum width of approximately 0.15 μm at its bottom portion.

Step 9 (see FIG. 16F): The etching mask 25 is formed on the surface of the resultant device.

Step 10 (see FIG. 16G): The first and second spacers 81 and 82 are removed by isotropic etching using the mask 25. Next, the doped polysilicon film 24 is patterned by anisotropic etching using the mask 25 to form the control gate electrode 9. Then, the mask 25 is removed. If the mask 25 is formed slightly off the optimal position in this process, the width of the extending section 85 of the thin film section 72 varies. Within the alignment precision of the mask 25, however, the first and second spacers 81 and 82 are never removed, while the extending section 85 may not be formed.

Step 11 (see FIG. 16H): After a mask 26 is formed, phosphorus ions are implanted into the substrate 1 to form the source region 3 as in the step 10 in the first embodiment.

Step 12 (see FIG. 16I): After a mask 27 is formed so as to cover at least the source region 3, arsenic ions are implanted into the surface of the substrate 1 to form the drain region 4 as in the step 11 in the first embodiment. The projection range of the arsenic ions then is approximately 0.3 μm. Some of the arsenic ions pass the extending section 85 of the thin film section 72 and the integrated first and second silicon oxide films 6 and 7 to reach inside the silicon substrate 1, thus forming the drain region 4. The other arsenic ions stop inside the thick film section 71 and the base sections 86 of thin film section 72 and the first and second spacers 81 and 82 without reaching the silicon substrate 1. As a result, the drain region 4 is defined in a self-aligned manner between two adjoining base sections 86 of thin film sections 72 (or two portions of thin film sections where the first and second spacers 81 and 82 are not located). The channel length of each select transistor 11 becomes the same as the sum of the widths of the thick film section 71 and the first and second spacers 81 and 82. The controllability and reproducibility of the widths of the individual sections 71, 81 and 82 are very high, so that the channel length of the select transistor 11 is always kept constant as in the first embodiment. Thereafter, the mask 27 is removed, which completes the memory cell array.

Although only five embodiments of the present invention have been described herein, it should be apparent to those skilled in the art that the present invention may be embodied in many other specific forms without departing from the spirit or scope of the invention. Particularly, it should be understood that the invention may be embodied in the following forms.

(1) In the first and fifth embodiments, the second spacer 13 or 82 may be omitted so that only the first spacer 12 or 81 is provided. In this case, the maximum width of the first spacer 12 or 81 may be made longer. Three or more spacers may be provided in which case the steps 4 and 5 (first embodiment) or the steps 7 and 8 (fifth embodiment) should be repeated.

(2) In the second and third embodiments, the silicon oxide film 55 may be replaced with a silicon oxinitride film. Further, this invention may be adapted to an MIS transistor which employs a stack of multiple insulating layers of different materials.

(3) In the first, fourth and fifth embodiments, the materials for the first and second spacers 12 and 13 or 81 and 82, the floating gate 8 and the control gate 9 may be replaced with various kinds of metals including high-melting point metals and a conductive material like silicide.

(4) In the second and third embodiments, this invention may be adapted to an IGFET in which the material for the gate electrode 56 or 62 is replaced with various kinds of metals including high-melting point metals and a conductive material like silicide.

(5) In the second and third embodiments, this invention may be adapted to a JEET in which the silicon oxide film 55 is omitted.

(6) In the second and third embodiments, the doped polysilicon layer 58 as the impurity diffusion source may be replaced with a layer which is formed of $POCl_3$, PSG (Phospho Silicate Glass), BSG (Boro Silicate Glass), AsSG (Arsenic Silicate Glass) or the like.

(7) In the first, fourth and fifth embodiments, the P-type single crystal silicon substrate 1 may be replaced with a P-type well.

(8) In the first, fourth and fifth embodiments, the ionized phosphorus to be implanted to form the source region 3 may be replaced with an ionized another N-type impurity such as of arsenic or antimony. The ionized arsenic to be implanted to form the drain region 4 may be replaced with an ionized another N-type impurity such as of phosphorus or antimony.

(9) In the first, fourth and fifth embodiments, the P-type single crystalline silicon substrate 1 may be replaced with an N-type single crystalline silicon substrate or an N-type well. In this case, an ionized P-type impurity like boron or indium is implanted to form the source region 3 and the drain region 4.

Figure 17:
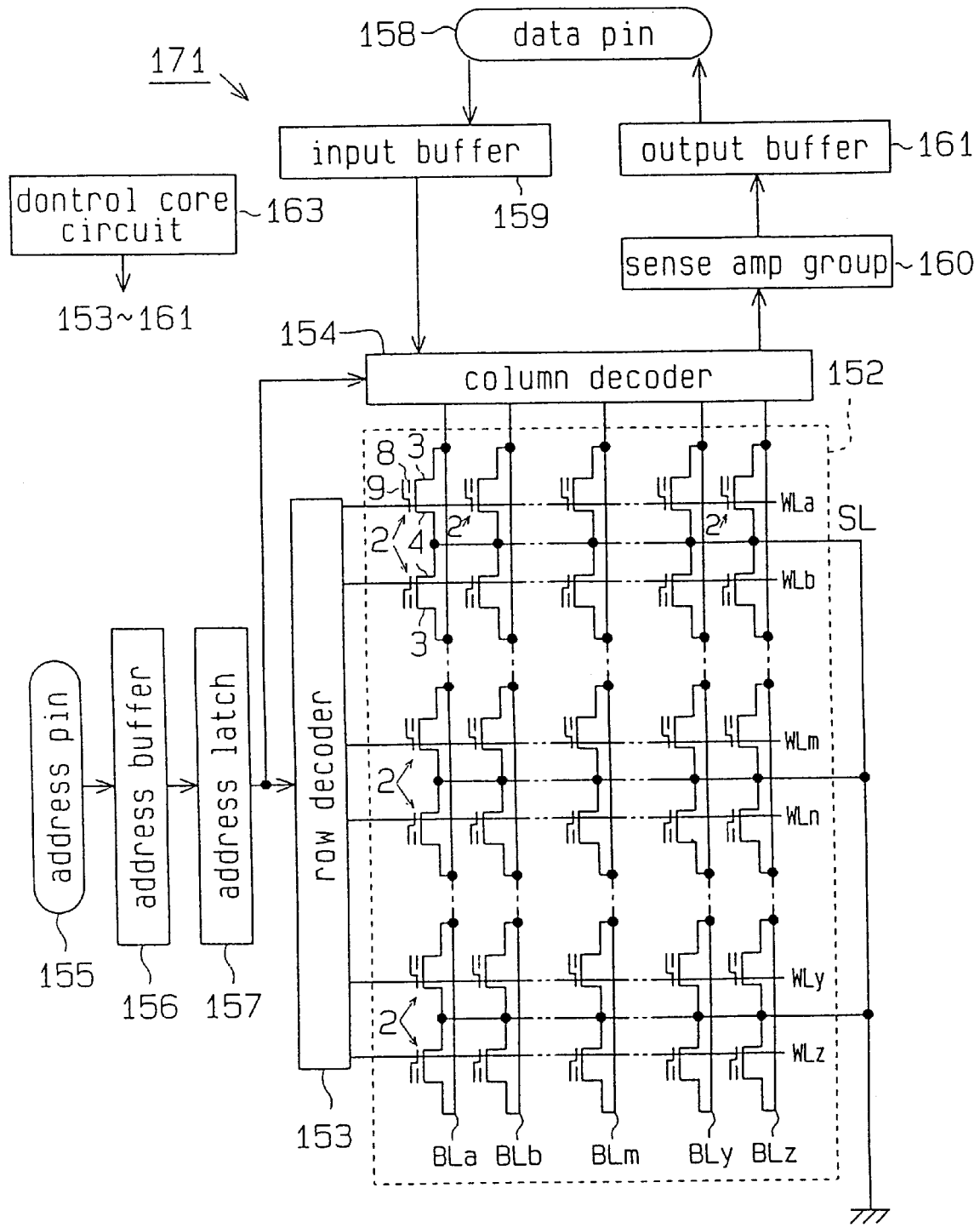
FIG. 17 is a block diagram showing a flash EEPROM according to another embodiment.

(10) In the first, fourth and fifth embodiments, the source region 3 of each split gate type memory cell 2 may be replaced with a drain region, and the drain region 4 with a source region. U.S. Pat. No. 5,029,130 discloses a flash EEPROM 171 as shown in FIG. 17. Each of multiple groups of memory cells in the individual rows have drain regions. Those drain regions are respectively connected to the bit lines BLa–BLz. The source regions of the entire memory cells 2 are commonly connected to the source line SL, which is grounded. FIG. 18 shows voltages to be applied to the source line SL, the bit lines BLa–BLz and the word lines WLa–WLz in the individual operation modes (write mode, erase mode and read mode) of the flash EEPROM 171.

Therefore, the present examples and embodiments are to be considered as illustrative and not restrictive and the invention is not to be limited to the details given herein, but may be modified within the scope of the appended claims.

What is claimed is:

1. A method for fabricating a semiconductor device comprising the steps of:

forming a projection over a semiconductor substrate of a first conductivity, said projection is a diffusion source for an impurity;

diffusing said impurity into said semiconductor substrate from said projection to define a first region having a second conductivity;

forming an insulating layer over said semiconductor substrate and said projection;

forming a conductive film over said insulating layer;

removing a portion of said conductive film by anisotropic etching to form a gate electrode having a thick film section located over said insulating layer and adjacent to a side wall of said projection and to form a thin film section having a thickness sufficient to pass an ionized impurity;

implanting the ionized impurity into said semiconductor substrate with said projection and said thick film section of said gate electrode used as masks to define a second region having said second conductivity, thereby allowing a portion of said second region to be defined under said thin film section.

2. A method for fabricating a split gate type transistor comprising the steps of:

forming a floating gate electrode over a semiconductor substrate having a first conductivity;

forming a side wall spacer adjoining to a side wall of said floating gate electrode;

forming a film of a conductive material over said floating gate electrode and said side wall spacer;

removing a portion of said conductive film to form a control gate electrode including a select gate, said select gate having a thick film section and a thin film section, said thick film section including said side wall spacer and being located adjacent to said floating gate electrode, said thin film being formed to have a thickness sufficient to pass a first ionized impurity;

implanting a second ionized impurity into said semiconductor substrate with said floating gate electrode used as a mask to define a first region having a second conductivity; and implanting the first ionized impurity into said semiconductor substrate with said control gate electrode used as a mask to define a second region having a second conductivity, thereby allowing a portion of said second region to be defined under said thin film section.

3. A method for fabricating a split gate type transistor comprising the steps of:

forming a first insulating layer over a semiconductor substrate having a first conductivity;

forming a floating gate electrode over said first insulating layer;

forming a second insulating layer over said floating gate electrode and said semiconductor substrate;

forming a first film of a conductive material over said second insulating layer;

removing a portion of said first film by etch-back to form a side wall spacer adjoining to a side wall of said floating gate electrode;

forming a second film of a conductive material over said second insulating layer and said side wall spacer;

removing a portion of said second film by anisotropic etching to form a control gate electrode including a select gate, said select gate having a thick film section and a thin film section, said thick film section including said side wall spacer and being located adjacent to said floating gate electrode, said thin film section being formed to have a thickness sufficient to pass a first ionized impurity;

implanting a second ionized impurity into said semiconductor substrate with said floating gate electrode used as a mask to define a first region having a second conductivity; and implanting the first ionized impurity into said semiconductor substrate with said control gate electrode used as a mask to define a second region having a second conductivity, thereby allowing a portion of said second region to be defined under said thin film section.

4. The method according to claim 3, wherein said first and second regions are drain and source, respectively.

5. A method for fabricating a split gate type transistor comprising the steps of:

forming a floating gate electrode over a semiconductor substrate having a first conductivity;

forming a control gate electrode including a select gate, said select gate having a thick film section and a thin film section, said thick film section being located adjacent to said floating gate electrode, said thin film section being located over said semiconductor substrate and being formed to have a thickness sufficient to pass an ionized impurity; and implanting the ionized impurity into said semiconductor substrate with said control gate electrode used as a mask to define a region having a second conductivity, thereby allowing a portion of said region to be defined under said thin film section.

6. The method according to claim 5, wherein said region is one of drain and source.

7. A method for fabricating a split gate type transistor comprising the steps of:

forming a first insulating layer over a semiconductor substrate having a first conductivity;

forming a floating gate electrode over said first insulating layer;

forming a second insulating layer over said floating gate electrode and said semiconductor substrate;

forming a control gate electrode including a select gate, said select gate having a thick film section and a thin film section, said thick film section being located adjacent to said floating gate electrode, said thin film section being formed to have a thickness sufficient to pass a first ionized impurity;

implanting a second ionized impurity into said semiconductor substrate with said floating gate electrode used as a mask to define a first region having a second conductivity; and implanting the first ionized impurity into said semiconductor substrate with said control gate electrode used as a mask to define a second region having a second conductivity, thereby allowing a portion of said second region to be defined under said thin film section.

8. The method according to claim 7, wherein said first and second regions are drain and source, respectively.

9. A method for fabricating a split gate type transistor comprising the steps of:

forming a floating gate electrode over a semiconductor substrate having a first conductivity;

forming a control gate electrode including a select gate, said select gate having a thick film section and a thin film section, said thick film section being located adjacent to said floating gate electrode, said thin film section being formed to have a thickness sufficient to pass a first ionized impurity;

forming a side wall spacer adjacent to said thick film section and located over a portion of said thin film section;

implanting a second ionized impurity into said semiconductor substrate with said floating gate electrode used as a mask to define a first region having a second conductivity; and implanting the first ionized impurity into said semiconductor substrate with said control gate electrode used as a mask to define a second region having a second conductivity, thereby allowing said second region to be defined under a remaining portion of said thin film section.

10. The method according to claim 9, wherein said first and second regions are drain and source, respectively.

11. A method for fabricating a split gate type transistor comprising the steps of:

forming a first insulating layer over a semiconductor substrate having a first conductivity;

forming a floating gate electrode over said first insulating layer;

forming a second insulating layer over said floating gate electrode and said semiconductor substrate;

forming a control gate electrode including a select gate, said select gate having a thick film section and a thin film section, said thick film section being located adjacent to said floating gate electrode, said thin film section being formed to have a thickness sufficient to pass a first ionized impurity;

forming a side wall spacer adjacent to said thick film section and located over a portion of said thin film section;

implanting a second ionized impurity into said semiconductor substrate with said floating gate electrode used as a mask to define a first region having a second conductivity; and implanting the first ionized impurity into said semiconductor substrate with said control gate electrode used as a mask to define a second region having a second conductivity, thereby allowing said second region to be defined under a remaining portion of said thin film section.

12. The method according to claim 11, wherein said first and second regions are drain and source, respectively.

13. A method for fabricating a split gate type transistor comprising the steps of:

forming a floating gate electrode over a semiconductor substrate having a first conductivity;

forming a control gate electrode located adjacent to the floating gate electrode, the control gate electrode forming step including a step of forming at least one side wall spacer included in the control gate electrode over the semiconductor substrate, wherein a thick film section of the control gate electrode is formed at a position where the at least one side wall spacer is formed, and wherein the thick film section serves as a select gate of a select transistor; and implanting an ionized impurity into the semiconductor substrate with the control gate electrode used as a mask to define a region having a second conductivity, thereby allowing the region to be defined at the end of the thick film section in a self-aligned manner.

* * * * *